(12) United States Patent
Chung

(10) Patent No.: US 9,893,064 B2
(45) Date of Patent: Feb. 13, 2018

(54) INTEGRATED CIRCUIT DEVICE AND METHOD OF MANUFACTURING THE SAME

(71) Applicant: Jae-yup Chung, Yongin-si (KR)

(72) Inventor: Jae-yup Chung, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/007,533

(22) Filed: Jan. 27, 2016

(65) Prior Publication Data

US 2016/0284705 A1  Sep. 29, 2016

(30) Foreign Application Priority Data

Mar. 25, 2015  (KR) .................. 10-2015-0041644

(51) Int. Cl.
*H01L 27/092* (2006.01)
*H01L 27/11* (2006.01)
*H01L 27/02* (2006.01)

(52) U.S. Cl.
CPC ...... *H01L 27/0924* (2013.01); *H01L 27/0207* (2013.01); *H01L 27/1104* (2013.01)

(58) Field of Classification Search
CPC ............. H01L 27/0924; H01L 27/0207; H01L 27/1104
USPC ...................................................... 257/369
See application file for complete search history.

(56) References Cited

U.S. PATENT DOCUMENTS

| 7,829,951 | B2 | 11/2010 | Song et al. |
| 7,830,703 | B2 | 11/2010 | Takeda et al. |
| 7,994,583 | B2 | 8/2011 | Inaba |
| 8,018,007 | B2 | 9/2011 | Chang et al. |
| 8,058,690 | B2 | 11/2011 | Chang |
| 8,130,529 | B2 | 3/2012 | Tanaka |
| 8,243,501 | B2 | 8/2012 | Ouchi et al. |
| 8,258,572 | B2 | 9/2012 | Liaw |
| 8,315,084 | B2 | 11/2012 | Liaw et al. |
| 8,338,251 | B2 | 12/2012 | Berthold et al. |
| 8,368,148 | B2 | 2/2013 | Inaba |

(Continued)

FOREIGN PATENT DOCUMENTS

| KR | 10-1385719 B1 | 4/2014 |
| KR | 2014-0074873 A | 6/2014 |

(Continued)

*Primary Examiner* — Marc Armand
*Assistant Examiner* — Sue Tang
(74) *Attorney, Agent, or Firm* — Harness, Dickey & Pierce

(57) ABSTRACT

An integrated circuit device includes a substrate, first and second fin-type active areas which extend in a first direction on the substrate, first and second gate lines on the substrate that extend in a second direction that crosses the first direction, and first and second contact structures. The first and second gate lines intersect the first and second fin-type active areas, respectively. The first contact structure is on the first fin-type active area at a side of the first gate line and contacts the first gate line. The second contact structure is on the second fin-type active area at a side of the second gate line. The first contact structure includes a first lower contact including metal silicide and a first upper contact on the first lower contact. The second contact structure includes a second lower contact including metal silicide and a second upper contact on the second lower contact.

20 Claims, 31 Drawing Sheets

(56) References Cited

U.S. PATENT DOCUMENTS

| | | |
|---|---|---|
| 8,378,429 B2 | 2/2013 | Chan et al. |
| 8,399,931 B2 | 3/2013 | Liaw et al. |
| 8,422,274 B2 | 4/2013 | Tomita et al. |
| 8,436,405 B2 | 5/2013 | Liaw |
| 8,492,215 B2 | 7/2013 | Yang et al. |
| 8,582,352 B2 | 11/2013 | Liaw |
| 8,653,630 B2 | 2/2014 | Liaw et al. |
| 8,669,186 B2 | 3/2014 | LiCausi |
| 8,674,448 B2 | 3/2014 | Pillarisetty et al. |
| 8,675,397 B2 | 3/2014 | Liaw |
| 8,716,810 B2 | 5/2014 | Chang et al. |
| 8,779,528 B2 | 7/2014 | Liaw |
| 8,830,732 B2 | 9/2014 | Liaw |
| 8,859,372 B2 | 10/2014 | Liaw |
| 8,942,030 B2 | 1/2015 | Liaw |
| 8,964,455 B2 | 2/2015 | Liaw |
| 8,964,457 B2 | 2/2015 | Liaw |
| 8,987,831 B2 | 3/2015 | Liaw |
| 2010/0200929 A1* | 8/2010 | Shin ............ H01L 27/1104 257/384 |
| 2011/0127611 A1* | 6/2011 | Lee ............. H01L 29/41791 257/368 |
| 2015/0123209 A1* | 5/2015 | Choi ............ H01L 27/11206 257/379 |
| 2015/0132903 A1 | 5/2015 | Liaw |
| 2015/0171093 A1 | 6/2015 | Liaw |
| 2016/0211251 A1* | 7/2016 | Liaw ............ H01L 27/0207 |

FOREIGN PATENT DOCUMENTS

| | | |
|---|---|---|
| KR | 2014-0101258 A | 8/2014 |
| KR | 10-1442353 B1 | 9/2014 |
| KR | 10-1445033 B1 | 9/2014 |
| KR | 10-1459220 B1 | 11/2014 |
| KR | 10-1461799 B1 | 11/2014 |

* cited by examiner

3E – 3E'

3G – 3G'

4D - 4D'

INTEGRATED CIRCUIT DEVICE AND METHOD OF MANUFACTURING THE SAME

CROSS-REFERENCE TO RELATED APPLICATION

This application claims priority under 35 U.S.C. § 119 to Korean Patent Application No. 10-2015-0041644, filed on Mar. 25, 2015, in the Korean Intellectual Property Office, the disclosure of which is incorporated herein in its entirety by reference.

BACKGROUND

The present disclosure relates to an integrated circuit device and/or a method of manufacturing the same, and more particularly, to an integrated circuit device including a fin field-effect transistor (FinFET) and/or a method of manufacturing the same.

For high speed electronic devices, semiconductor devices in the electronic devices have been miniaturized. A FinFET has been proposed as one example of semiconductor miniaturization technology. In a FinFET, a gate may be formed on a fin protruding from a substrate so that the fin is used as a three-dimensional channel.

SUMMARY

The present disclosure relates to an integrated circuit device with improved integration density and performance.

The present disclosure relates to a method of manufacturing the integrated circuit device.

According to example embodiments, an integrated circuit device includes a substrate, a first fin-type active area and a second fin-type active area spaced apart from each other on the substrate, a first gate line and a second gate line on the substrate, a first contact structure on the first fin-type active area, and a second contact structure on the second fin-type active area. The first and second fin-type active areas extend in a first direction. The first and second gate lines extend in a second direction that crosses the first direction. The first and second gate lines intersect the first and second fin-type active areas, respectively. The first contact structure is at a side of the first gate line. The first contact structure contacts the first gate line. The second contact structure is at a side of the second gate line. The first contact structure includes a first upper contact on a first lower contact. The first lower contact includes metal silicide. The second contact structure includes a second upper contact on a second lower contact. The second lower contact includes metal silicide.

In example embodiments, the first upper contact may contact an upper surface of the first gate line.

In example embodiments, the first lower contact may extend in the second direction.

In example embodiments, the first and second fin-type active areas may protrude from the substrate in a direction perpendicular to a main surface of the substrate. The first lower contact may extend to cover side walls and an upper surface of the first fin-type active area. The first lower contact may extend to cover side walls and an upper surface of the second fin-type active area.

In example embodiments, a width of the first upper contact in the first direction may be greater than a width of the second upper contact in the first direction.

In example embodiments, a portion of the first gate line that contacts the first upper contact may be a dummy gate.

In example embodiments, a portion of the first gate line that contact the first upper contact may vertically overlap side walls of the first fin-type active area.

In example embodiments, the first upper contact may include a first portion and a second portion. The first portion of the first upper contact may contact the first lower contact. The second portion of the first upper contact may protrude downwardly from a side of the first portion and may contact the first gate line.

In example embodiments, a bottom surface of the second portion of the first upper contact may be lower than an upper surface of the first lower contact.

In example embodiments, an upper surface of the first lower contact may be higher than an upper surface of the first gate line.

In example embodiments, the first contact structure may further include a first lower barrier layer that surrounds side walls and a bottom surface of the first lower contact. The second structure may further include a second lower barrier layer that surround side walls and a bottom surface of the second lower contact.

In example embodiments, the first fin-type active area may include a pair of PMOS active areas arranged apart from each other. The second fin-type active area may include a pair of NMOS active areas. The pair of PMOS active areas may be between the pair of NMOS active areas.

In example embodiments, a first distance between the pair of PMOS active areas may be substantially equal to a second distance between one of the pair of NMOS active areas and one of the pair of NMOS active areas that is adjacent to the one of the pair of PMOS active areas.

In example embodiments, the first fin-type active area may include a pair of PMOS active areas. The second fin-type active area may include two pairs of NMOS active areas. Each pair of the two pairs of NMOS active areas may be arranged at each of both sides of the pair of PMOS active areas.

In example embodiments, a first distance between the pair of PMOS active areas may be substantially equal to second distance between one of the pair of PMOS active areas and one of the two pairs of NMOS active areas that is adjacent to the one of the pair of PMOS active areas.

In example embodiments, a first distance between the pair of PMOS active areas may be greater than a third distance between one pair of NMOS active areas among the two pairs of NMOS active areas.

According to example embodiments, an integrated circuit device includes a substrate, and a static random-access memory array on the substrate. The static random-access memory array includes a plurality of static random-access memory cells. The static random-access memory array includes a plurality of first fin-type active areas and a plurality of second fin-type active areas on the substrate and extending in a first direction, a first gate line and a second gate line on the substrate and extending in a second direction that crosses the first direction, and a first contact structure on one of the plurality of first fin-type active areas at a side of the first gate line and a second contact structure on one of the plurality of second fin-type active areas at a side of the second gate line. The first gate line and the second gate line intersect the plurality of first fin-type active areas and the plurality of second fin-type active areas, respectively. The first contact structure includes a first lower contact on the plurality of first fin-type active areas, a first upper contact on the first lower contact, and a first lower barrier layer which surrounds side walls of the first lower contact. The first upper contact contacts a portion of the first gate line.

In example embodiments, the first lower contact may include metal silicide.

In example embodiments, the second lower contact structure may include a second lower contact on the plurality of second fin-type active areas, and a second upper contact on the second lower contact. The second upper contact may be formed so the second upper contact does not contact the first gate line or the second gate line. A height of an upper surface of the first lower contact may be substantially equal to a height of an upper surface of the second lower contact.

In example embodiments, the second lower contact may extend in the second direction. The second lower contact may contact the plurality of second fin-type active areas.

In example embodiments, a plurality of portions of the first gate line may intersect the plurality of first fin-type active areas. The plurality of portions of the first gate line may be positioned on sidewalls of the plurality of first fin-type active areas, and may form a dummy transistor.

In example embodiments, the static random-access memory array may include a plurality of inverters. Each of the inverters may include a pull-up transistor and a pull-down transistor, a plurality of pass transistors connected to output nodes of the plurality, the first gate line shared by the pull-up transistor and the pull-down transistor, and the second gate line shared by two pass transistors selected from the plurality of pass transistors.

In example embodiments, the static random-access memory array may include a plurality of NMOS transistors and a plurality of PMOS transistors. The second gate line may be shared by two NMOS transistors among the plurality of NMOS transistors.

In example embodiments, the static random-access memory array may include a plurality of NMOS transistors and a plurality of PMOS transistors. The first gate line may be shared by two transistors that have different conductive-type channels. The two transistors may be part of the plurality of NMOS transistors and the plurality of PMOS transistors.

According to example embodiments, a method of manufacturing an integrated circuit device includes forming on a first fin-type active area and a second fin-type active area on a substrate, the first and second fin-type active areas extending in a first direction that is parallel to a main surface of the substrate; forming a first gate line and a second gate line on the first and second fin-type active areas, respectively, the first and second gate lines extending in a second direction that crosses the first direction, the first gate line intersecting the first fin-type active area, and the second gate line intersecting the second fin-type active area; and forming a first contact structure on the first fin-type active area at a side of the first gate line and forming a second contact structure on the second fin-type active area at a side of the second gate line. The first and second contact structures each include metal silicide.

In example embodiments, the forming of the first contact structure and the forming of the second contact structure may include forming first and second barrier layers on inner walls and bottom portions of the first and second openings, and forming on the first and second barrier layers the first and second lower contacts filling the first and second openings.

In example embodiments, the method may further include forming an etch stop layer and a second insulating interlayer on the insulating interlayer and forming third openings through the etch stop layer and the second insulating interlayer. The insulating interlayer may be first insulating interlayer. The third openings may expose a portion of an upper surface of the first gate line and an upper surface of the first lower contact.

According to example embodiments, an integrated circuit device includes a plurality of fins extending in a first direction, the fins being spaced apart from each other in a second direction that crosses the first direction, the plurality of fins including a first fin and a second fin; a first lower contact extending in the second direction over the first fin and the second fin; a second lower contact on the second fin and spaced apart from the first lower contact, the first and second lower contacts being formed of metal silicide; a first gate line on the first fin and extending in the second direction; a second gate line on the second fin and extending in the second direction, the first and second gate lines being spaced apart from each other, a first upper contact on the first gate line and the first lower contact, the first upper contact extending in the first direction; and a second upper contact on the second lower contact.

In example embodiments, the integrate circuit device may further include a substrate and a plurality of first and second gate lines on the substrate. The first fin may be one of a plurality of first fins formed in the substrate that extend in the first direction. The plurality of first fins may include two first fins that are spaced apart from each other in the second direction. The second fin may be one of a plurality of second fins formed in the substrate. The plurality of second fins may include two second fins that are spaced apart from each other in the second direction and on the substrate. The two first fins may be disposed between the two second fins. A first one of the first gate lines may extend in the second direction over the two first fins and a first one of the two second fins. A second one of the first gate lines may extend in the second direction over the two first fins and a second one of the two second fins. A first one of the second gate lines may be connected to the first one of the two second fins. A second one of the second gate lines may be connected to the second one of the two second fins.

In example embodiments, the integrated circuit device may further include a gate insulating layer between the first gate line and the first fin. The first gate line may include a first portion and a second portion. The first portion may be on an upper surface of the first fin. The second portion may be adjacent to a sidewall of the first fin. The gate insulating layer may be between the first fin and the first and second portions of the first gate line.

In example embodiments, an upper surface of the first lower contact may be higher than an upper surface of the first gate line.

In example embodiments, the integrated circuit may further include a substrate. The first and second fins may be formed in the substrate. The first fin may include a channel area of a PMOS transistor. The second fin may include a channel area of a NMOS transistor.

BRIEF DESCRIPTION OF THE DRAWINGS

Example embodiments of inventive concepts will be more clearly understood from the following description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION OF EXAMPLE EMBODIMENTS

Figure 1A:
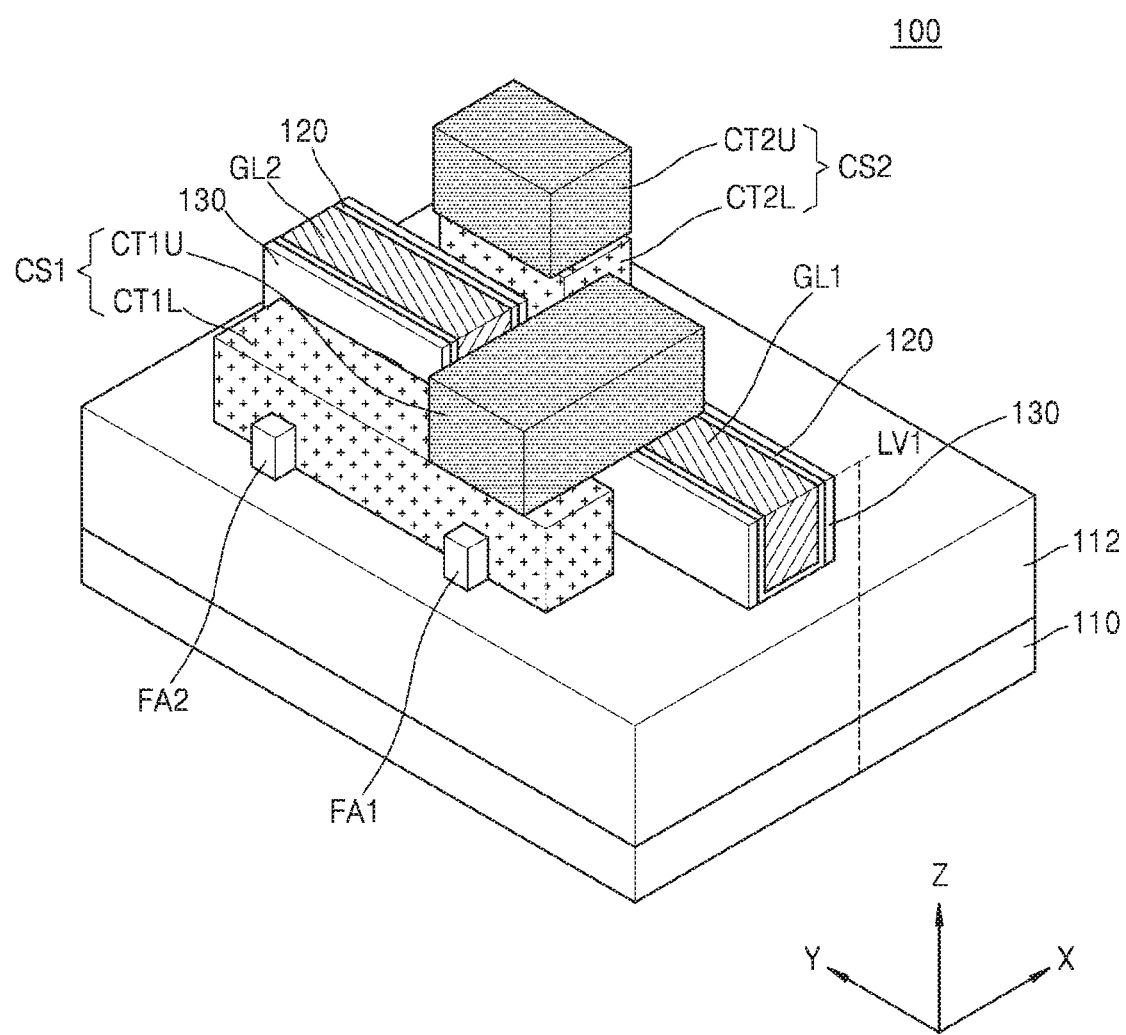
FIGS. 1A through 1F illustrate a perspective view, a plan view, and cross-sectional views of integrated circuit device according to example embodiments.

Inventive concepts now will be described more fully hereinafter with reference to the accompanying drawings, in which elements of example embodiments are shown. Inventive concepts may, however, be embodied in many different forms and should not be construed as limited to the example embodiments set forth herein. Rather, these embodiments are provided so that this disclosure will be thorough and complete, and will fully convey the scope of inventive concepts to one of ordinary skill in the art. In the drawings, the thicknesses of layers and regions are exaggerated for clarity. Like reference characters and/or numerals in the drawings denote like elements, and thus their description may not be repeated.

As used herein, the term "and/or" includes any and all combinations of one or more of the associated listed items. Expressions such as "at least one of," when preceding a list of elements, modify the entire list of elements and do not modify the individual elements of the list.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between," versus "directly between," "adjacent," versus "directly adjacent," etc.).

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, example embodiments of inventive concepts will be described in detail by referring to the accompanying drawings.

Figure 1B:
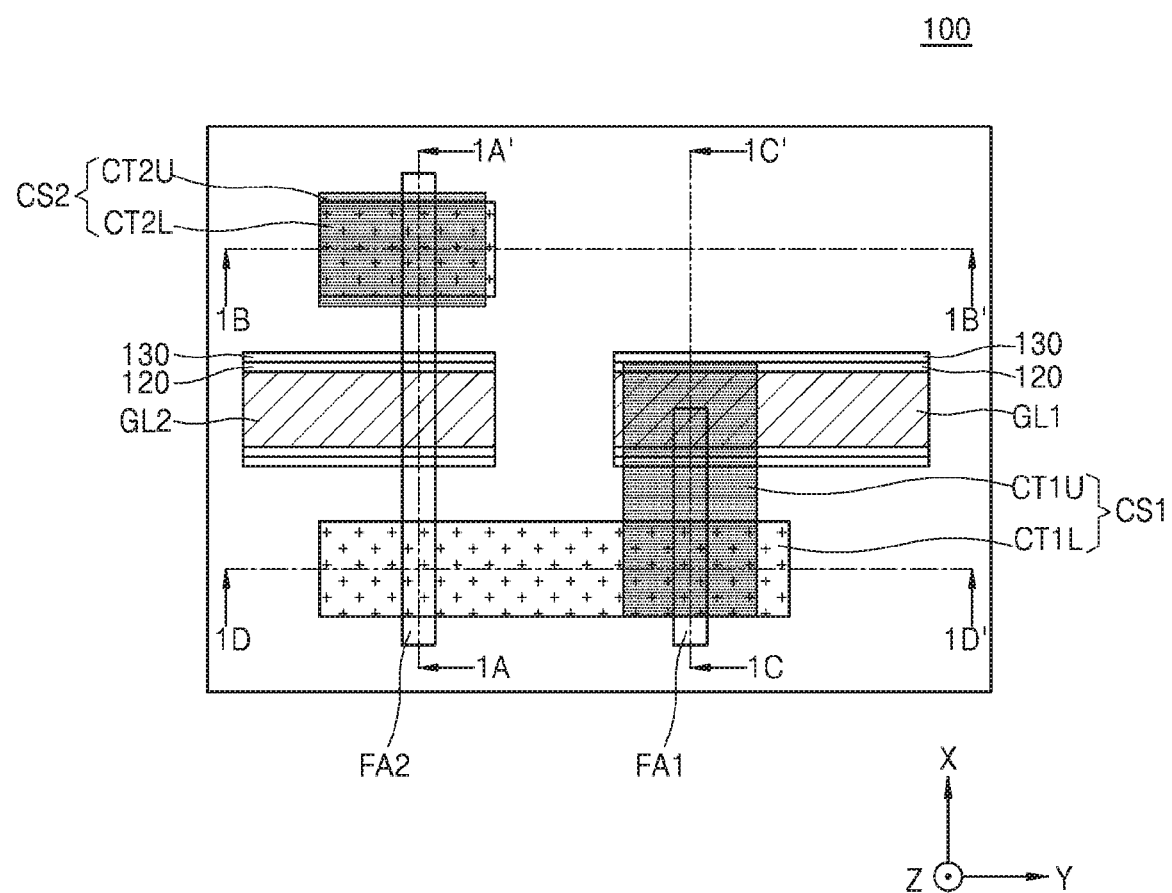
Figure 1C:
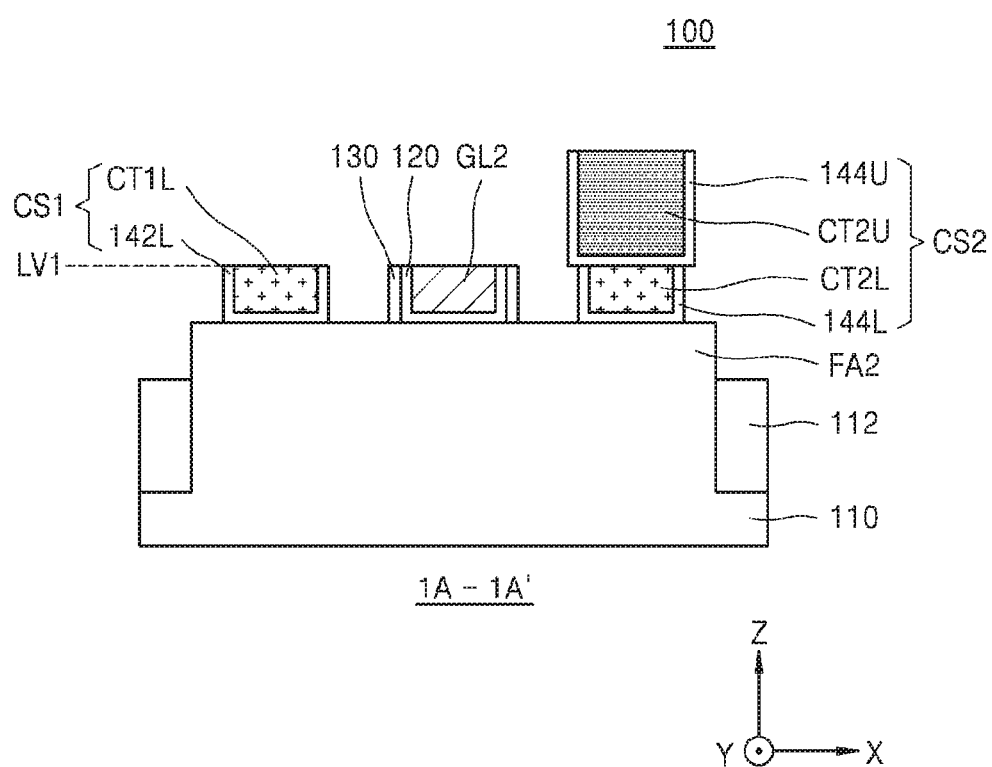
Figure 1D:
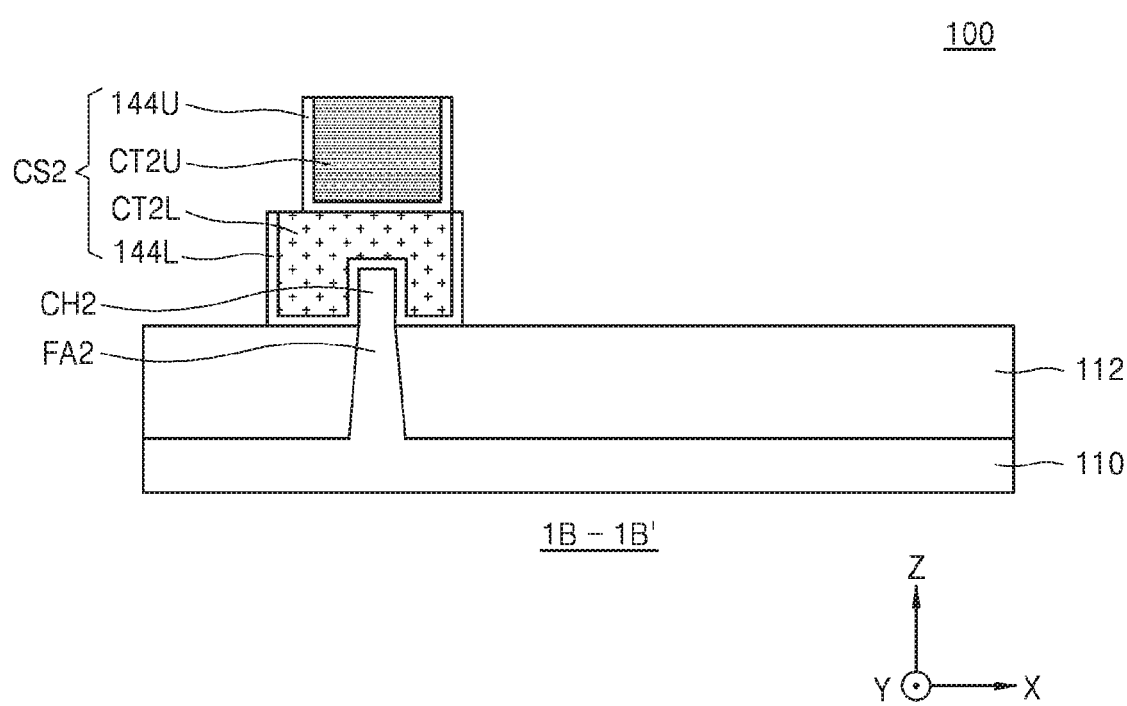
Figure 1E:
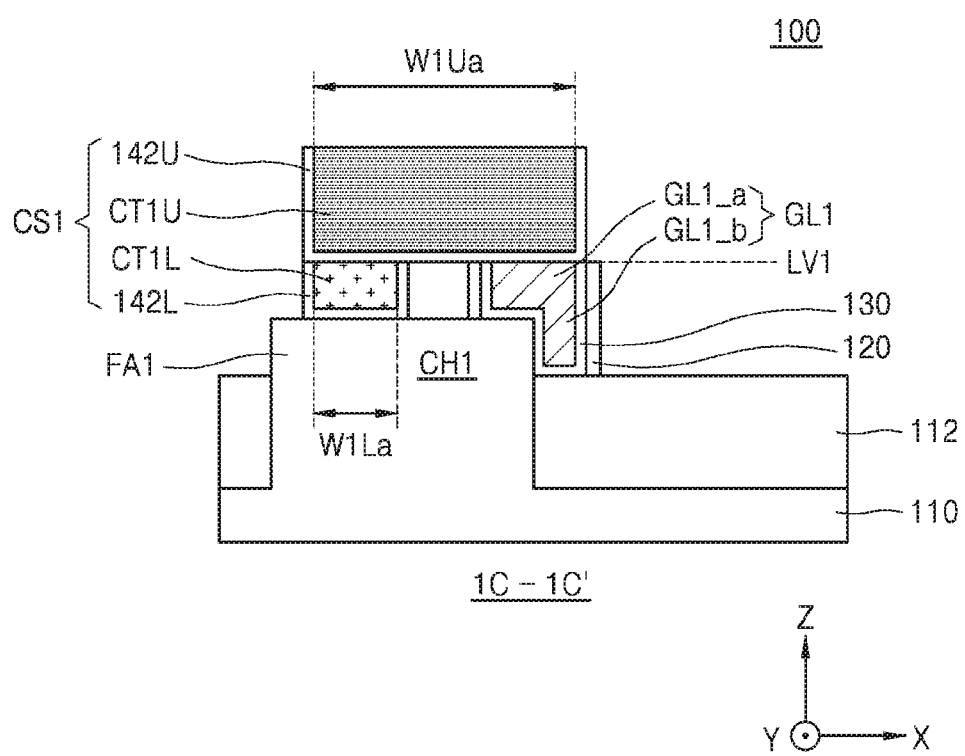
Figure 1F:
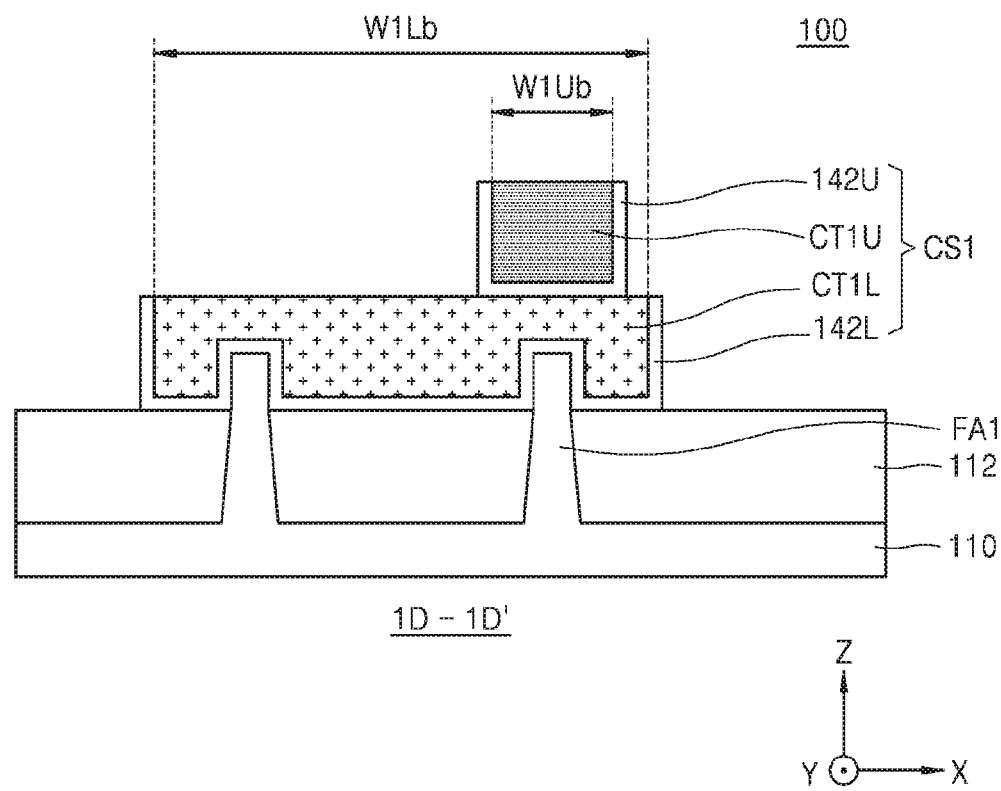

FIGS. 1A through 1F illustrate a perspective view, a plan view, and sectional views of integrated circuit device according to example embodiments. FIG. 1A is a perspective view of main components of the integrated circuit device 100. FIG. 1B is a plan view of the integrated circuit device 100 of FIG. 1A. FIG. 1C is a cross-sectional view taken along line 1A-1A' of FIG. 1B. FIG. 1D is a cross-sectional view taken along line 1B-1B' of FIG. 1B. FIG. 1E is a cross-sectional view taken along line 1C-1C' of FIG. 1B. FIG. 1F is a cross-sectional view taken along line 1D-1D' of FIG. 1B. For convenience, a first upper barrier layer 142U and a second upper barrier layer 144U and a first lower barrier layer 142L and a second lower barrier layer 144L are omitted in FIG. 1A.

Referring to FIGS. 1A through 1F, the integrated circuit device 100 may include a substrate 110 on which a first fin-type active area FA1 and a second fin-type active area FA2 are formed. In example embodiments, the substrate 110 may be a semiconductor substrate including a semiconductor material, such as silicon, germanium, silicon germanium, silicon carbide, gallium arsenide, indium arsenide, and indium phosphide. In example embodiments, the substrate 110 may have a silicon on insulator (SOI) structure. For example, the substrate 110 may include a buried oxide (BOX) layer. The substrate 110 may include a conductive area, for example, a well doped with impurities or a structure doped with impurities.

The first and second fin-type active areas FA1 and FA2 may protrude from the substrate 110 in a direction Z that is perpendicular to a main surface of the substrate 110, and may have a first conductive-type channel area CH1 and a second conductive-type channel area CH2, respectively. According to example embodiments, the first conductive-type channel area CH1 may be a channel area for a p-type metal oxide semiconductor (PMOS) transistor, and the second conductive-type channel area CH2 may be a channel area for an n-type metal oxide semiconductor (NMOS) transistor. The first channel area CH1 may be n-type. The second channel area CH2 may be p-type. However, example embodiments are not limited thereto.

The first and second fin-type active areas FA1 and FA2 may extend in a first direction (a direction X) that is parallel to the main surface of the substrate 110. For example, the first fin-type active area FA1 may have a long side along the direction X, which is the direction in which the first fin-type active area FA1 extends, and may have a short side along a direction Y which is perpendicular to the direction X.

A first trench (not shown) extending in the direction X may be formed between the first and second fin-type active areas FA1 and FA2, and the isolation layer 112 may be formed on the first trench. On the substrate 110, a first gate line GL1 and a second gate line GL2 may extend in a straight line in a second direction (the direction Y) that crosses the direction in which the first and second fin-type active areas FA1 and FA2 extend. The first gate line GL1 may extend on the isolation layer 112 to cross the first fin-type active area FA1 while covering an upper surface and both side surfaces of the first fin-type active area FA1, and the second gate line GL2 may extend on the isolation layer 112 to cross the second fin-type active area FA2 while covering an upper surface and both side surfaces of the second fin-type active area FA2.

Each of the first gate line GL1 and the second gate line GL2 may extend in the second direction (the direction Y), and may have an upper surface which extends in parallel with an upper surface of the substrate 110 at a first level LV1 on the substrate 110. The upper surfaces of the first gate line GL1 and the second gate line GL2 may extend in a direction that is parallel to an extension direction of the substrate 110, that is, an extension direction of an X-Y plane.

According to example embodiments, the first gate line GL1 and the second gate line GL2 may have a structure in which a metal nitride layer, a metal layer, a conductive capping layer, and a gap-filling metal layer are sequentially stacked. Each of the metal nitride layer and the metal layer may include at least one metal selected from Ti, Ta, W, Ru, Nb, Mo, and Hf. Each of the metal nitride layer and the metal layer may be formed by atomic layer deposition (ALD), metal organic ALD (MOALD), or metal organic chemical vapor deposition (MOCVD). The conductive capping layer may serve as a protection layer which limits and/or prevents a surface oxidization of the metal layer. Also, the conductive capping layer may serve as a wetting layer which makes a deposition process easy when another conductive layer is deposited on the metal layer. The conductive capping layer may be formed of metal nitride, such as TiN and TaN, or a combination thereof. However, the conductive capping layer is not limited thereto. The gap-filling metal layer may be arranged on the conductive capping layer, on side walls and upper surfaces of the first and second fin-type active areas FA1 and FA2. The gap-filling metal layer may be formed of a tungsten (W) layer or a TiN layer. The gap-filling metal layer may be formed by ALD, CVD, or physical vapor deposition (PVD). The gap-filling metal layer may bury a recess which is formed on the side walls and the upper surfaces of the first and second fin-type active areas FA1 and FA2 due to a step portion on an upper surface of the conductive capping layer, without a void.

A gate insulating layer 120 may be interposed between the first gate line GL1 and the first fin-type active area FA1, and gate spacers 130 may be formed on both side walls of the first gate line G11. The gate insulating layer 120 may also be interposed between the first gate line GL1 and the gate spacer 130. The gate insulating layer 120 may be interposed between the second gate line GL2 and the second fin-type active area FA2, and the gate spacers 130 may be formed on both side walls of the second gate line GL2. The gate insulating layer 120 may also be interposed between the second gate line GL2 and the gate spacer 130.

A first contact structure CS1 may be formed on the first fin-type active area FA1 at a side of the first gate line GL1 and a second contact structure CS2 may be formed on the second fin-type active area FA2 at a side of the second gate line GL2.

The first contact structure CS1 may include a first lower contact CT1L which covers the upper surfaces and the both side walls of the first and second fin-type active areas on the isolation layer 112, and a first upper contact CT1U which is arranged on the first lower contact CT1L and contacts the first gate line GL1.

The first lower contact CT1L may extend at a side of the first gate line GL1 along the extension direction (the direction Y) of the first gate line GL1. The first lower contact CT1L may extend to cover the upper surface and the both side walls of the first fin-type active area FA1 and to cover the upper surface and the both side walls of the second fin-type active area FA2. The first lower contact CT1L may have an upper surface whose height is equal to or greater than those of upper surfaces of the first gate line GL1 and the second gate line GL2. However, example embodiments are not limited thereto. The first upper contact CT1U may be formed on the first lower contact CT1L and may contact a portion of the upper surface of the first gate line GL1. The first upper contact CT1U may have a long side extending along the direction (the direction X) that crosses the extension direction of the first gate line GL1 and a short side extending along the extension direction (the direction Y) of the first gate line GL1.

As illustrated in FIGS. 1E and 1F, the first lower contact CT1L may extend along the extension direction of the first and second gate lines GL1 and GL2, and the first upper contact CT1U may extend on the first lower contact CT1L in the direction that crosses the extension direction of the first lower contact CT1L. That is, a first width W1Ua of the first upper contact CT1U in the direction X may be greater than a second width W1La of the first lower contact CT1L in the direction X. Meanwhile, a third width W1Ub of the first upper contact CT1U in the direction Y may be smaller than a fourth width W1Lb of the first lower contact CT1L in the direction Y. Accordingly, the first upper contact CT1U and the first lower contact CT1L extending in the direction X and the direction Y, respectively, may vertically overlap each other on the first fin-type active area FA1 at a side of the first gate line GL1.

According to example embodiments, the first lower contact CT1L may include metal silicide. For example, the first lower contact CT1L may include nickel silicide, cobalt silicide, tungsten silicide, tantalum silicide, etc. However, materials of the first lower contact CT1L are not limited thereto. According to example embodiments, the first upper contact CT1U may include a conductive material, such as a metal, metal nitride, or polysilicon doped with impurities. However, materials of the first upper contact CT1U are not limited thereto.

The first lower barrier layer 142L may cover side walls and a bottom surface of the first lower contact CT1L, and the first upper barrier layer 142U may cover side walls and a bottom surface of the first upper contact CT1U. The first lower barrier layer 142L and the first upper barrier layer 142U may be conformally formed on the side walls and the bottom surfaces of the first lower contact CTL1 and the first upper contact CT1U, respectively, in a desired (and/or alternatively predetermined) thickness. For example, the first lower barrier layer 142L and the first upper barrier layer 142U may include titanium nitride, tantalum nitride, tungsten nitride, titanium carbon nitride, etc. According to example embodiments, the first lower barrier layer 142L and the first upper barrier layer 142U may have a thickness of about 10 to 100 Å. However, example embodiments are not limited thereto.

The first lower barrier layer 142L may be interposed between the first lower contact CT1L and the first fin-type active area FA1 to serve as a barrier limiting and/or preventing the first lower contact CT1L and the first fin-type active area FA1 from directly contacting each other. In particular, the first lower barrier layer 142L may limit and/or prevent deterioration in the performance of the integrated circuit device 100, which may occur when a material which is used in a process of forming the first lower contact CT1L, such as a source gas, penetrates into the first fin-type active area FA1. Also, the first upper barrier layer 142U may limit and/or prevent damage in the first upper contact CT1U and the first lower contact CT1L, which may be caused by an undesired chemical reaction due to a direct contact between the first upper contact CT1U and the first lower contact CT1L.

The second contact structure CS2 may include a second lower contact CT2L which covers the upper surface and the both side walls of the second fin-type active area FA2 on the isolation layer 112, and a second upper contact CT2U which is arranged on the second lower contact CT2L.

The second lower contact CT2L may cover the upper surface and the both side walls of the second fin-type active area FA2 at a side of the second gate line GL2. While the second lower contact CT2L may be arranged on the second fin-type active area FA2 at a side of the second gate line GL2, the first lower contact CT1L may be arranged on the second fin-type active area FA2 at the other side of the second gate line GL2. Thus, the first lower contact CT1L and the second lower contact CT2L, each of which is arranged to cross the second fin-type active area FA2, may be apart from each other with the second gate line GL2 therebetween. The second lower contact CT2L does not contact the first fin-type active area FA1. According to example embodiments, the second lower contact CT2L may have an upper surface whose height is equal to or greater than those of upper surfaces of the first gate line GL1 and the second gate line GL2. However, example embodiments are not limited thereto.

The second upper contact CT2U may be formed on the second lower contact CT2L. The second upper contact CT2U may have a bottom surface whose height is substantially the same as that of a bottom surface of the first upper contact CT1U. However, example embodiments are not limited thereto.

The second lower barrier layer 144L may cover side walls and a bottom surface of the second lower contact CT2L, and the second upper barrier layer 144U may cover side walls and the bottom surface of the second upper contact CT2U.

According to example embodiments, the second lower contact CT2L may include metal silicide. For example, the second lower contact CT2L may include nickel silicide, cobalt silicide, tungsten silicide, tantalum silicide, etc. However, materials of the second lower contact CT2L are not limited thereto. According to example embodiments, the second upper contact CT2U may include a conductive material, such as a metal, metal nitride, or polysilicon doped with impurities. However, materials of the second upper contact CT2U are not limited thereto.

According to example embodiments, the first contact structure CS1 may be used as a storage node contact of a static random access memory (SRAM) device. For example, the first contact structure CS1 may connect drains of a pull-down transistor and a pull-up transistor realized by the first gate line GL1 to a pass gate realized by the second gate line GL2. Also, the second contact structure CS2 may be used as a bit line contact, a complementary bit line contact, a power node contact, or a ground node contact of the SRAM device. However, example embodiments are not limited thereto.

In the integrated circuit device 100 described by referring to FIGS. 1A through 1F, the first contact structure CS1 and the second contact structure CS2 include the first lower contact CT1L and the second lower contact CT2L including metal silicide, respectively. Also, the first lower barrier layer 142L and the second lower barrier layer 144L cover the side walls and the bottom surfaces of the first lower contact CT1L and the second lower contact CT2L, respectively. Since the first contact structure CS1 and the second contact structure CS2 include metal silicide, the first contact structure CS1 and the second contact structure CS2 may have a decreased contact resistance. Accordingly, the performance of the integrated circuit device 100 including the first and second contact structures CS1 and CS2 may be improved.

Also, since the first contact structure CS1 and the second contact structure CS2 may have the decreased contact resistance since the first contact structure CS1 and the second contact structure CS2 include metal silicide, the integrated circuit device 100 having a sufficiently low contact resistance may be realized by using the contact structures CS1 and CS2 having relatively small sizes (for example, widths and heights). Accordingly, the integration density of the integrated circuit device 100 may be improved.

In addition, the first and second lower barrier layers 142L and 144L may protect the first and second fin-type active areas FA1 and FA2 from physical and chemical damages, which may be applied to the first and second fin-type active areas FA1 and FA2 and/or the adjacent first and second gate lines GL1 and GL2 in the process of forming the first and second lower contacts CT1L and CT2L. Accordingly, the first and second contact structures CS1 and CS2 having increased sizes may be formed in relatively narrow spaces between the first and second fin-type active areas FA1 and FA2, and between the first and second gate lines GL1 and GL2 (for example, distances between the first and second contact structures CS1 and CS2, and between the first and second gate lines GL1 and GL2 may be decreased), so that the integration density of the integrated circuit device 100 may be improved.

The first gate line GL1 may include a first portion GL1_a and a second portion GL1_b and the first portion GL1_a of the first gate line GL1 may be arranged on an upper surface of the first conductive-type channel area CH1 and the second portion GL1_b of the first gate line GL1 may be arranged on the isolation layer 112 between a side wall of the first conductive-type channel area CH1 and the gate spacer 130.

Figure 2:
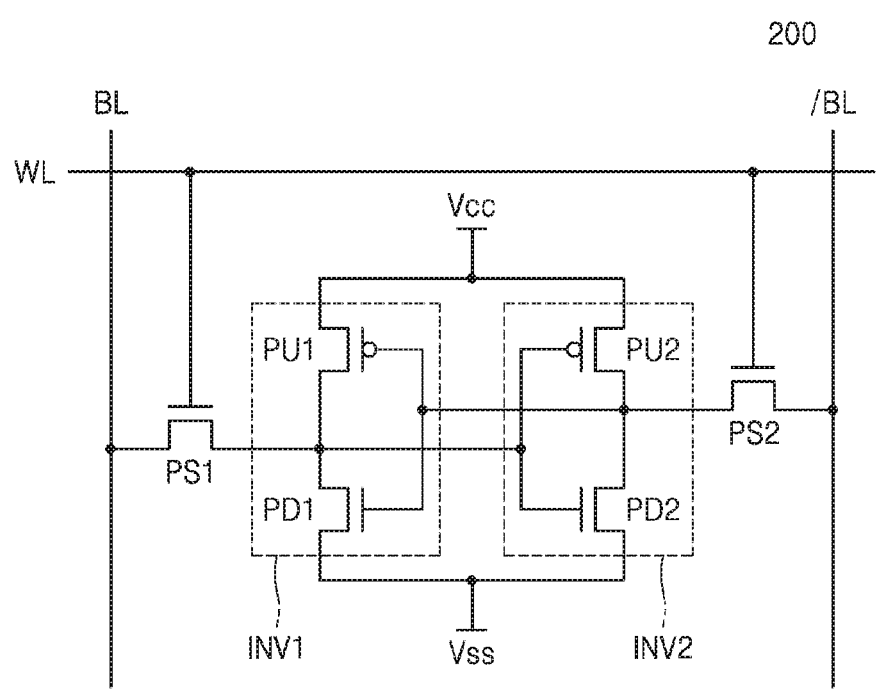
FIG. 2 is a circuit diagram for describing an integrated circuit device according to example embodiments.

FIG. 2 is a circuit diagram for describing an integrated circuit device 200 according to example embodiments. FIG. 2 illustrates the circuit diagram of a 6T SRAM cell including six transistors.

Referring to FIG. 2, the integrated circuit device 200 may include a pair of inverters INV1 and INV2 connected in parallel between a power node Vcc and a ground node Vss, and a first pass transistor PS1 and a second pass transistor PS2 connected to output nodes of the pair of inverters INV1 and INV2, respectively. The first pass transistor PS1 and the second pass transistor PS2 may be connected to a bit line BL and a complementary bit line/BL, respectively. Gates of the first pass transistor PS1 and the second pass transistor PS2 may be connected to word lines WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first pull-up transistor PU1 and the second pull-up transistor PU2 may be formed as PMOS transistors and the first pull-down transistor PD1 and the second pull-down transistor PD2 may be formed as NMOS transistors.

An input node of the first inverter INV1 may be connected to the output node of the second inverter INV2 and an input node of the second inverter INV2 may be connected to an output node of the first inverter INV1 so that the first inverter INV1 and the second inverter INV2 form one latch circuit.

Figure 3A:
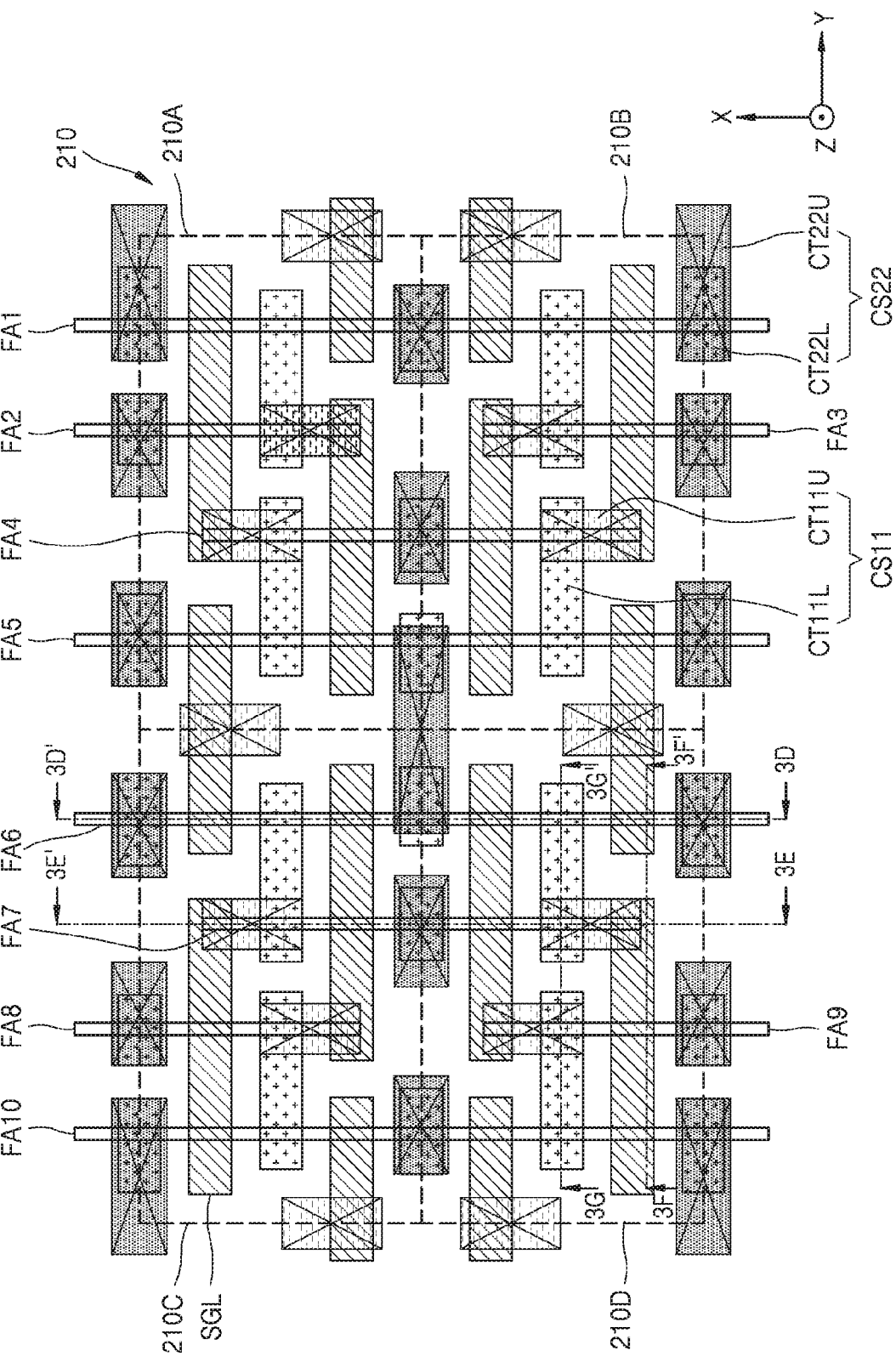
FIGS. 3A through 3G illustrate a plan view, a layout view, and cross-sectional views of an integrated circuit device according to example embodiments.
Figure 3B:
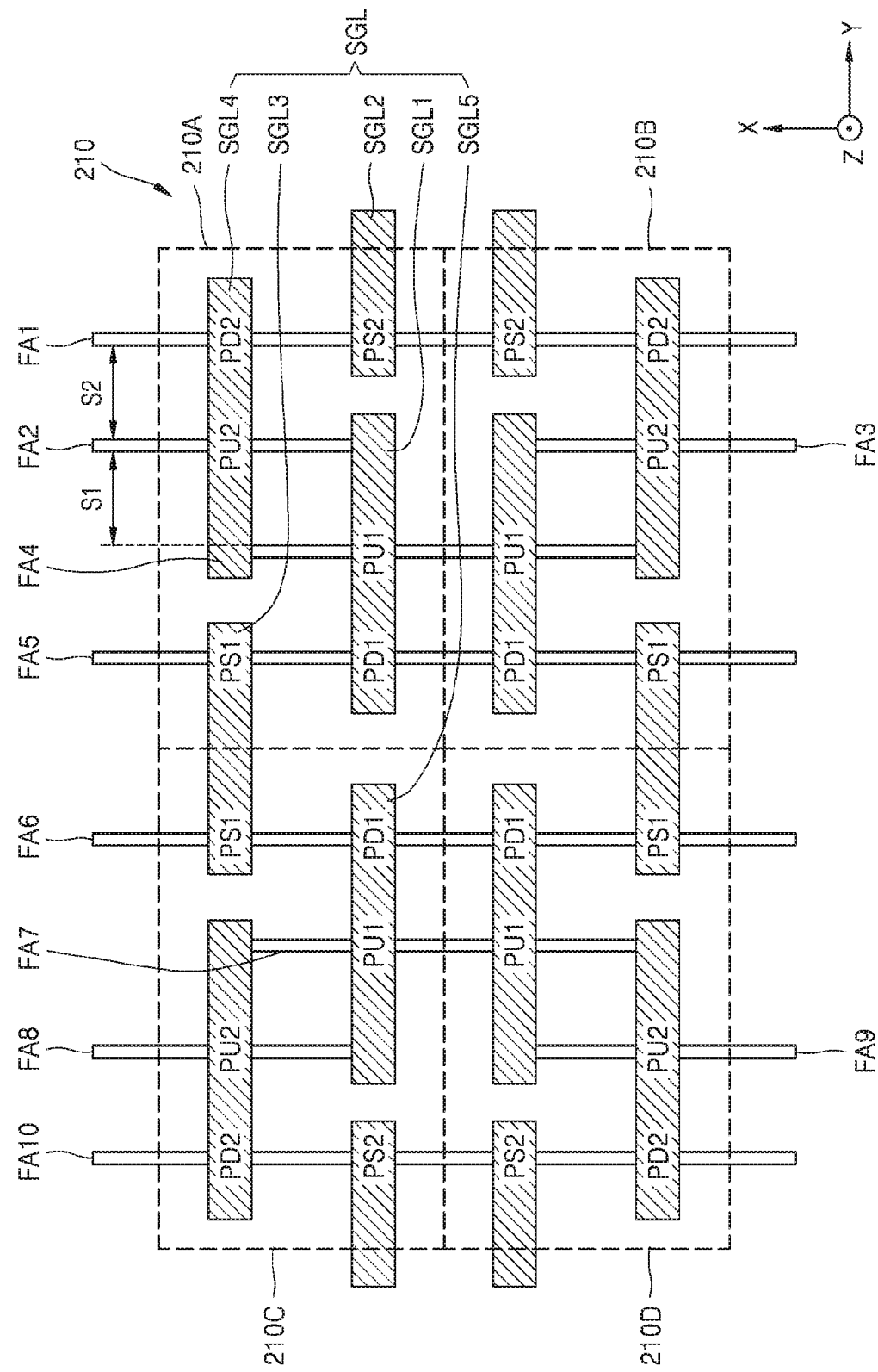
Figure 3C:
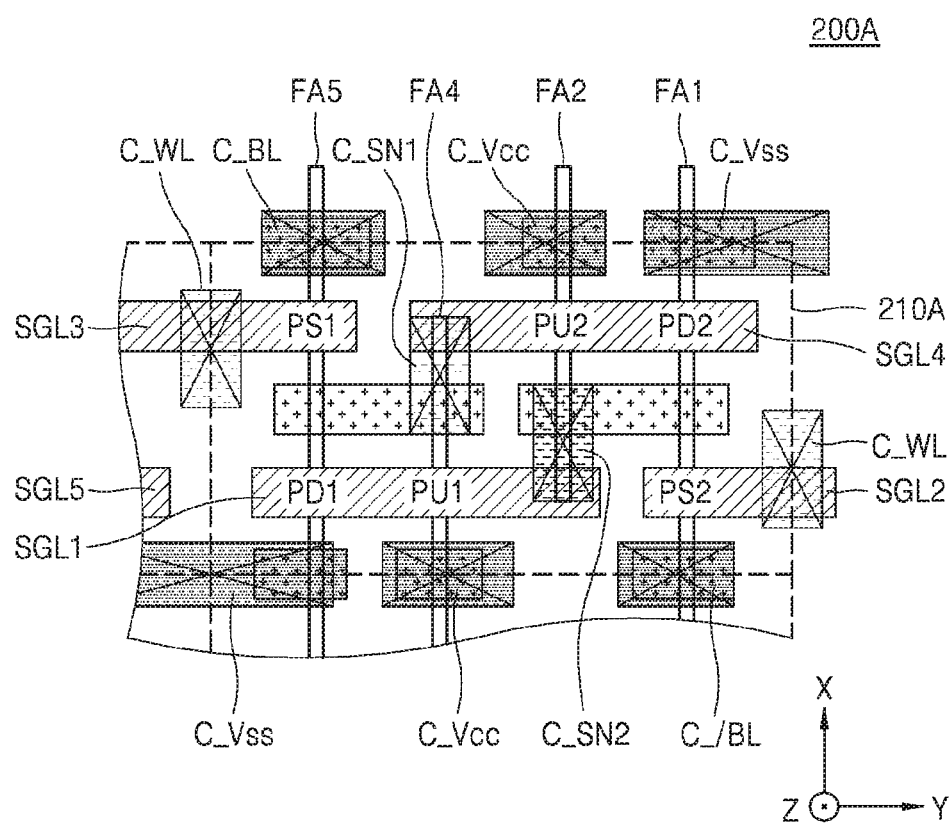
Figure 3D:
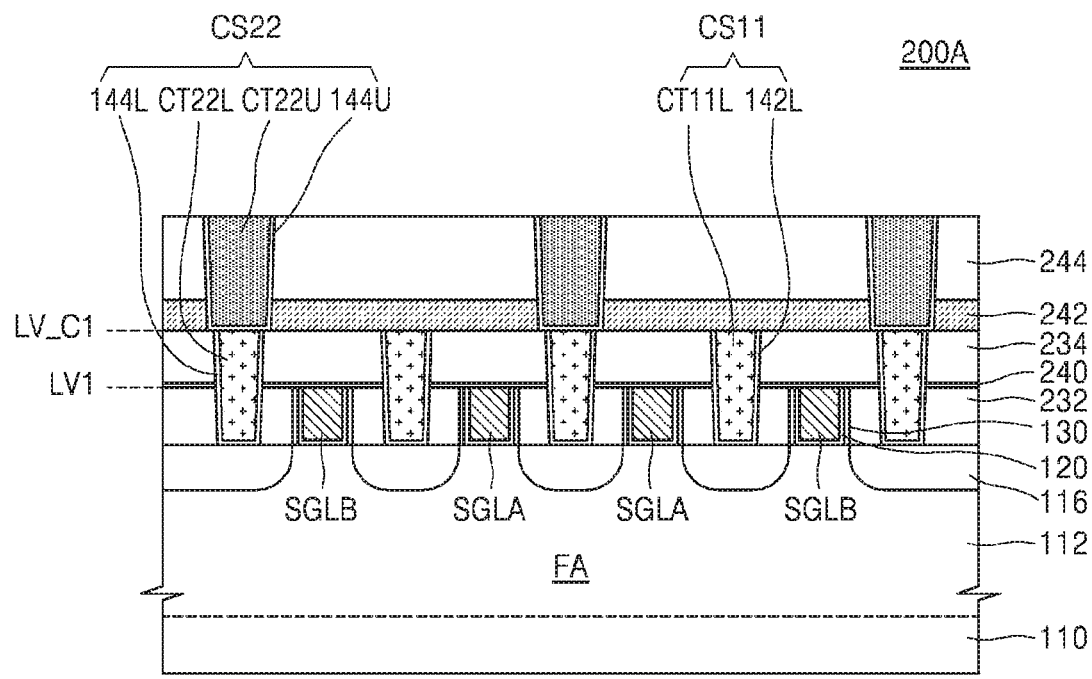
Figure 3D:
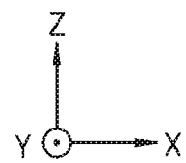
Figure 3E:
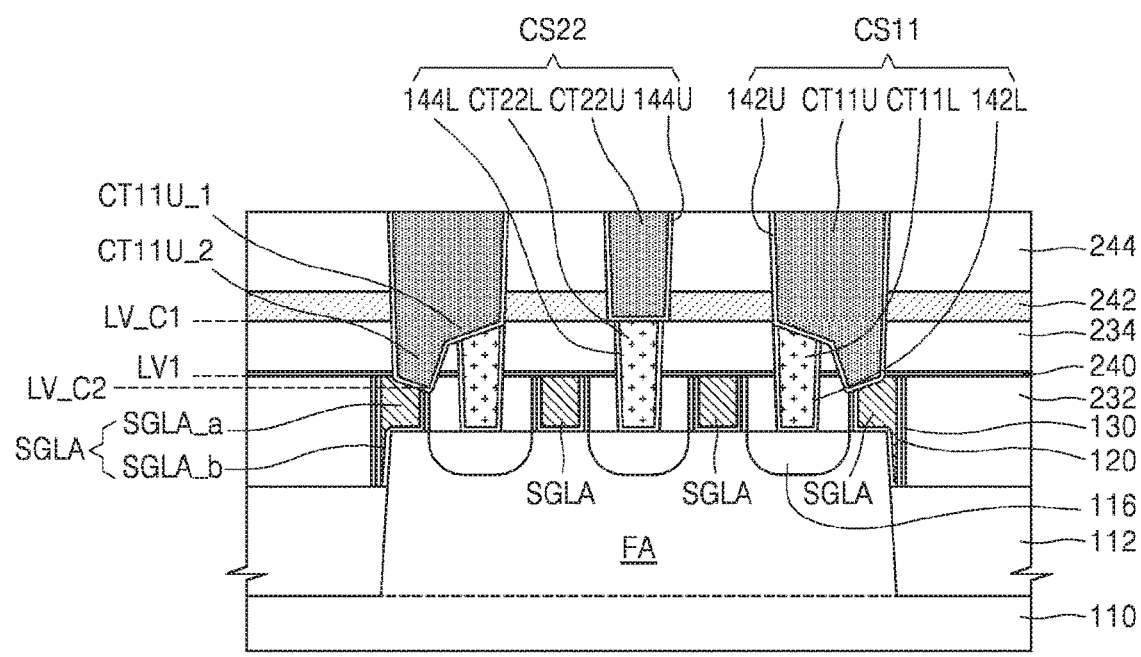
Figure 3E:
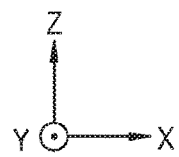
Figure 3F:
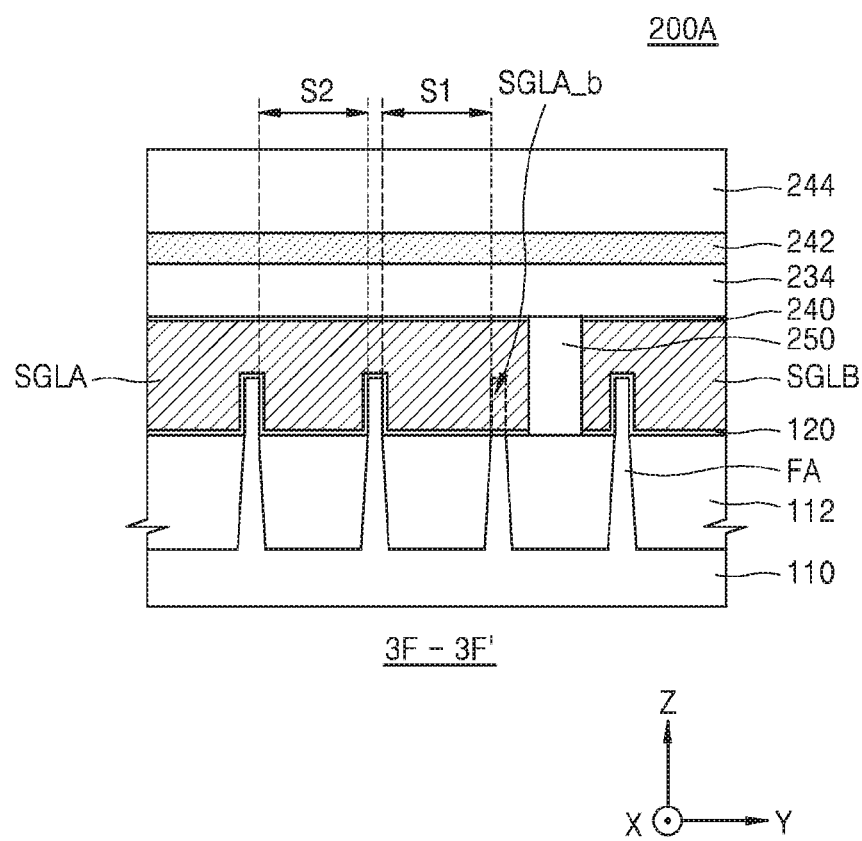
Figure 3G:
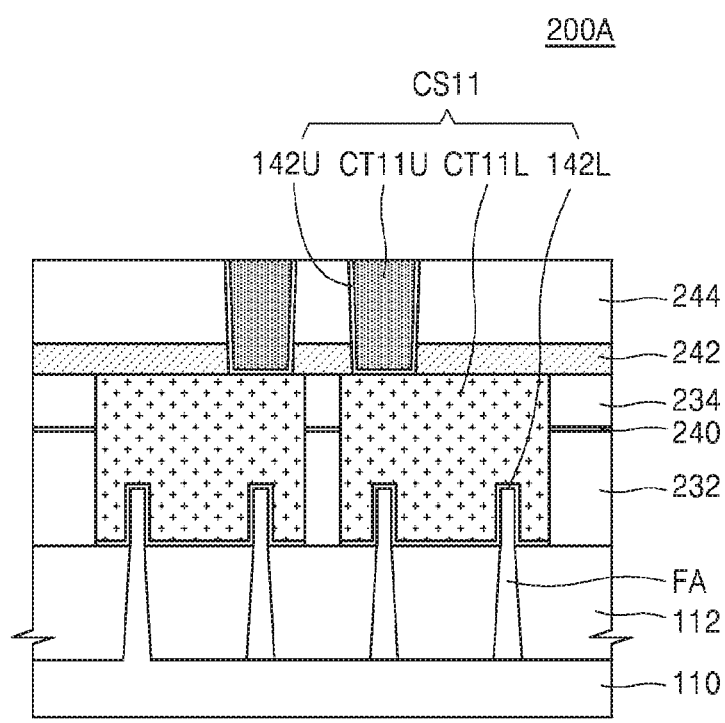

FIGS. 3A through 3G illustrate a plan view, a layout view, and cross-sectional views of an integrated circuit device according to example embodiments. FIG. 3A is a plan view of the main components of the integrated circuit device 200A. FIG. 3B is a layout view briefly illustrating arrangement of a fin-type active area FA and gate lines SGL of FIG. 3A. FIG. 3C is an enlarged view of a static random-access memory (SRAM) cell 210A of FIG. 3A. FIG. 3D is a cross-sectional view taken along line 3D-3D' of FIG. 3A. FIG. 3E is a cross-sectional view taken along line 3E-3E' of FIG. 3A, FIG. 3F is a cross-sectional view taken along line 3F-3F' of FIG. 3A. FIG. 3G is a cross-sectional view taken along line 3G-3G' of FIG. 3A. In FIGS. 3A through 3G, like reference numerals refer to like elements in FIGS. 1A through 1F, and their detailed descriptions will be omitted.

Referring to FIGS. 3A through 3G, the integrated circuit device 200A includes an SRAM array 210 including a plurality of SRAM cells 210A, 210B, 210C, and 210D which are arranged in a matrix on the substrate 110. FIGS. 3A through 3F illustrate four SRAM cells 210A, 210B, 210C, and 210D, each of which includes six fin field-effect transistors (FinFETs).

The SRAM array 210 may include the characteristics of the integrated circuit device 100 that is described with reference to FIGS. 1A through 1F.

Each of the plurality of SRAM cells 210A, 210B, 210C, and 210D includes a plurality of fin-type active areas FAs (e.g., FA1 to FA 10), which extend in parallel to one another along a first direction (a direction X). Each of the plurality of fin-type active areas FAs may protrude from the substrate 110 in a direction Z that is perpendicular to a main surface of the substrate 110.

Also, the plurality of SRAM cells 210A, 210B, 210C, and 210D may include a plurality of gate lines SGL which extend to cover both side walls and upper surfaces of the plurality of fin-type active areas FA, and extend in parallel to one another in a second direction (a direction Y) that crosses the first direction (the direction X). Two adjacent gate lines SGL from among the plurality of gate lines SGL, which extend in a straight line, may have structures corresponding to those of the first gate line (GL1 of FIG. 1A) and the second gate line (GL2 of FIG. 1A) described with reference to FIGS. 1A through 1F.

Each of the first pull-up transistor PU1, the first pull-down transistor PD1, the first pass transistor PS1, the second pull-up transistor PU2, the second pull-down transistor PD2, and the second pass transistor PS2 forming the plurality of SRAM cells 210A, 210B, 210C, and 210D may be formed as a fin-type transistor. In particular, each of the first pull-up transistor PU1 and the second pull-up transistor PU2 may be formed as a PMOS transistor, and each of the first pull down transistor PD1, the second pull-down transistor PD2, the first pass transistor PS1, and the second pass transistor PS2 may be formed as an NMOS transistor.

Transistors may be formed at intersection points at which the plurality of fin-type active areas FAs extending in the direction X intersect with the plurality of gate lines SGLs extending in the direction Y. For example, each transistor may be formed at each of six intersection points between the plurality of fin-type active areas FAs and the plurality of gate lines SGLs, in the SRAM cell 210A, so that six transistors may be formed in the SRAM cell 210A.

As illustrated in FIG. 3B, in the SRAM cell 210A, the first pass transistor PS1 may be formed at an intersection point at which a fin-type active area FA5 and a gate line SGL3 intersect with each other. The second pass transistor PS2 is formed at an intersection point at which a fin-type active area FA1 and a gate line SGL2 intersect with each other. The first pull-down transistor PD1 is formed at an intersection point at which the fin-type active area FA5 and a gate line SGL1 intersect with each other. The second pull-down transistor PD2 is formed at an intersection point at which the fin-type active area FA1 and a gate line SGL4 intersect with each other. The first pull-up transistor PU1 is formed at an intersection point at which a fin-type active area FA4 and the gate line SGL1 intersect with each other. The second pull-up transistor PU2 is formed at an intersection point at which a fin-type active area FA2 and the gate line SGL4 intersect with each other.

Each of the plurality of gate lines SGL1 to SGL5 may be shared by two transistors. For example, as in the SRAM cell 210A, the gate line SGL1 may be shared by the first pull-down transistor PD1 and the first pull-up transistor PU1. Also, the gate line SGL2 which extends along an extension direction of the gate line SGL1 on a straight line with the gate line SGL1 may form the second pass transistor PS2.

In two adjacent SRAM cells 210A and 210C, the gate line SGL1 of two adjacent gate lines SGL which extend in the extension direction of the gate line SGL in a straight line, the gate line SGL1 being located in the SRAM cell 210A, may be shared by the first pull-up transistor PU1 and the first pull-down transistor PD1 forming the SRAM cell 210A, and the gate line SGL5 of the two adjacent gate lines SGL, which is located in the SRAM cell 210C may be shared by the first pull-up transistor PU1 and the first pull-down transistor PD1 forming the SRAM cell 210C.

In example embodiments, each of two adjacent gate lines SGLs from among the plurality of gate lines SGL1 to SGL5, the two adjacent gate lines SGLs extending in the extension direction of the gate line SGL in a straight line, may be shared by two transistors having the same conductive-type channels.

In example embodiments, each of two adjacent gate lines SGLs from among the plurality of gate lines SGL1 to SGL5, the two adjacent gate lines SGLs extending in the extension direction of the gate line SGL in a straight line, may be shared by two transistors having different conductive-type channels.

In example embodiments, any one of two adjacent gate lines SGLs from among the plurality of gate lines SGL1 to SGL5, the two adjacent gate lines SGLs extending in the extension direction of the gate line SGL in a straight line, may be shared by two transistors having the same conductive-type channels, and the other gate line SGL may be shared by two transistors having different conductive-type channels.

As illustrated in FIG. 3B, the gate line SGL1 forming the SRAM cell 210A may be shared by the first pull-down transistor PD1 formed as an NMOS transistor and the first pull-up transistor PU1 formed as a PMOS transistor. The gate line SGL5 that is adjacent to the gate line SGL1 and forms the SRAM cell 210C may be shared by the first pull-down transistor PD1 formed as an NMOS transistor and the first pull-up transistor PU1 formed as a PMOS transistor.

Also, in two adjacent SRAM cells 210A and 210B, the gate line SGL4 of two adjacent gate lines SGLs extending in a straight line, the gate line SGL4 being located in the SRAM cell 210, may be shared by the second pull-up transistor PU2 formed as a PMOS transistor and the second pull-down transistor PD2 formed as an NMOS transistor, and the gate line SGL3 that is adjacent to the gate line SGL4 may be shared by two first pass transistors PS1s formed as NMOS transistors.

As illustrated in FIG. 3C, various contact structures may be arranged in the SRAM cell 210A. In detail, one word line contact C_WL may be connected to the gate line SGL3 of the first pass transistor PS1, and the other word line contact C_WL may be connected to the gate line SGL2 of the second pass transistor PS2. A bit line contact C_BL may be connected to a drain of the first pass transistor PS1, and a complementary bit line contact C_/BL may be connected to a drain of the second pass transistor PS2. One power node contact C_Vcc may be connected to a source of the first pull-up transistor PU1, and the other power node contact C_Vcc may be connected to a source of the second pull-up transistor PU2. One ground node contact C_Vss may be connected to a source of the first pull-down transistor PD1, and the other ground node contact C_Vss may be connected to a source of the second pull-down transistor PD2. A first storage node contact C_SN1 may be connected to the source of the first pass transistor PS1 and the drains of the first pull-up transistor PU1 and the first pull-down transistor PD1. A second storage node contact C_SN2 may be connected to the source of the second pass transistor PS2 and the drains of the second pull-up transistor PU2 and the second pull-down transistor PD2.

At least one of the first and second storage node contacts C_SN1 and C_SN2 may include characteristics similar to those of the first contact structure (CS1 of FIG. 1A) of the integrated circuit device 100 described with reference to FIGS. 1A through 1F, and at least one of the bit line contact C_BL, the complementary bit line contact C_/BL, the power node contact C_Vcc and the ground node contact C_Vss may include characteristics similar to those of the second contact structure (CS2 of FIG. 1A) of the integrated circuit device 100. Here, for convenience of explanation, at least one of the first and second storage node contacts C_SN1 and C_SN2 will be referred to as a first contact structure CS11, and at least one of the bit line contact C_BL, the complementary bit line contact C_/BL, the power node contact C_Vcc and the ground node contact C_Vss will be referred to as a second contact structure CS22.

As illustrated in FIG. 3A, the plurality of fin-type active areas FA1 to FA10 may be arranged to be apart from one another in the direction X, and the first contact structure CS11 or the second contact structure CS22 may be formed on the plurality of fin-type active areas FAs at a side of the gate line SGL.

The first contact structure CS11 may be formed on a fin-type active area FA having a channel area of a first conductive-type, from among the plurality of fin-type active areas FA1 to FA10, at a side of the gate line SGL shared by two transistors having different conductive-type channels. The second contact structure CS22 may be formed on a fin-type active area FA having a channel area of a second conductive-type, from among the plurality of fin-type active areas FA1 to FA10, at the other side of the gate line SGL shared by two transistors having different conductive-type channels. According to example embodiments, a channel area of a first conductive-type may be a PMOS channel area and a channel area of a second conductive-type may be an NMOS channel area.

As illustrated in FIG. 3C, in the SRAM cell 210A, the first storage node contact C_SN1 may be formed at an intersection point at which the gate line SGL4 shared by two transistors having different conductive-type channels and the fin-type active area FA4 having the channel area of the first conductive-type intersect with each other, and the second storage node contact C_SN2 may be formed at an intersection point at which the gate line SGL1 shared by two transistors having different conductive-type channels and the fin-type active area FA2 having the channel area of the first conductive type intersect with each other.

Also, here, for convenience of explanation, the gate line SGL shared by two transistors having different conductive-type channels will be referred to as a first gate line SGLA and the gate line SGL shared by two transistors having the same conductive-type channels will be referred to as a second gate line SGLB. The first gate line SGLA and the second gate line SGLB may include characteristics similar to those of the first gate line GL1 and the second gate line GL2 of the integrated circuit device 100 described with reference to FIGS. 1A through 1F.

The first contact structure CS11 may be formed on the fin-type active area FA having the channel area of the first conductive-type, from among the plurality of fin-type active areas FA1 to FA10, at a side of the first gate line SGLA, and a top portion of the first contact structure CS11 may contact a portion of an upper surface of the first gate line SGLA.

The first contact structure CS11 may include a first lower contact CT11L formed on the fin-type active area FA having the channel area of the first conductive-type, from among the plurality of fin-type active areas FA1 to FA10, and a first upper contact CT11U formed on the first lower contact CT11L and contacting the first gate line SGLA.

As illustrated in FIGS. 3A through 3C, the first lower contact CT11L may extend in a direction (a direction Y) that is parallel to the first and second gate lines SGLA and SGLB (for example, the first lower contact CT11L may have two long sides extending in the direction (the direction Y) that is parallel to the first and second gate lines SGLA and SGLB.). In the SRAM cell 210A from among the plurality of SRAM cells 210A, 210B, 210C, and 210D, the first lower contact CT11L may be formed on the fin-type active area FA2 at a side of a gate line SGL1, and the first lower contact CT11L may extend to cover the adjacent fin-type active area FA1. Also, in the SRAM cell 210A, the first lower contact CT11L may be formed on the gate line SGL1 and on the fin-type active area FA4 at a side of the gate line SGL4, and the first lower contact CT11L may extend to cover the adjacent fin-type active area FA5.

The first upper contact CT11U may extend in a direction (the direction X) that intersects with the first gate line SGLA, and may contact the adjacent first gate line SGLA (for example, the first upper contact CT11U may have two long sides extending in the direction that crosses the first gate line SGLA.). As illustrated in FIG. 3C, in the SRAM cell 210A from among the plurality of SRAM cells 210A, 210B, 210C, and 210D, the first upper contact CT11U may be arranged on the first lower contact CT11L which is arranged on the fin-type active area FA2 at a side of the gate line SGL1, such that the first upper contact CT11U contacts the gate line SGL1. Also, in the SRAM cell 210A, the first upper contact CT11U may be arranged on the first lower contact CT11L which is arranged on the fin-type active area FA4 at a side of the gate line SGL4, such that the first upper contact CT11U contacts the gate line SGL4.

As illustrated in FIGS. 3D and 3E, the first upper contact CT11U includes a first portion CT11U_1 and a second portion CT11U_2 which have bottom surfaces of different heights, and the first portion CT11U_1 may be formed on the first lower contact CT11L. The second portion CT11U_2 may contact an upper surface of the adjacent first gate line SGLA, at a side of the first portion CT11U_1.

An upper surface level LV1 of the first gate line SGLA may be lower than an upper surface level LV_C1 of the first lower contact CT11L. Thus, the first portion CT11U_1 of the first upper contact CT11U may have a bottom surface whose height is substantially the same as the upper surface level LV_C1 of the first lower contact CT11L. Also, a lower surface level LV_C2 of the second portion CT11U_2 of the first upper contact CT11U may be lower than the upper surface level LV_C1 of the first lower contact CT11L or a lower surface level of the first portion CT11U_1 of the first upper contact CT11U. As illustrated in FIGS. 3D and 3E, the second portion CT11U_2 of the first upper contact CT11U may be lower than the upper surface level LV1 of the first gate line SGLA due to, for example, a regional difference in an etch rate in an etch process for forming the first upper contact CT11U. However, example embodiments are not limited thereto, and the second portion CT11U_2 of the first upper contact CT11U may be located on a level which is substantially the same as the upper surface level LV1 of the first gate line SGLA.

As illustrated in FIGS. 3D and 3E, a portion of the first gate line SGLA, which contacts the first upper contact CT11U, may vertically overlap a side wall of a short side of the fin-type active area FA. The first gate line SGLA may include a first portion SGLA_a and a second portion SGLA_b, and the first portion SGLA_a of the first gate line SGLA may be arranged on an upper surface of the fin-type active area FA and the second portion SGLA_b of the first gate line SGLA may be arranged on the side wall of the short side of the fin-type active area FA. The second portion SGLA_b of the first gate line SGLA may form a dummy transistor in the SRAM cell 210A.

Similarly with the descriptions with reference to FIGS. 1A through 1F, the first lower barrier layer 142L may be formed on side walls and a bottom surface of the first lower contact CT11L, and the first upper barrier layer 142U may be formed on side walls and a bottom surface of the first upper contact CT11U.

The second contact structure CS22 may be formed on a fin-type active area FA, on which the first contact structure is not arranged, from among the plurality of fin-type active areas FAs. As illustrated in FIG. 3C, in the SRAM cell 210A, the first contact structure CS11 (or the second storage node contact C_SN2) and the second contact structure CS22 (or the power node contact C_Vcc) may be formed on the fin-type active area FA2 at both sides of the gate line SGL4. Also, the first contact structure CS11 (or the first storage node contact C_SN1) and the second contact structure CS22 (or the bit line contact C_BL) may be formed on the fin-type active area FA5 at both sides of the gate line SGL3.

The second contact structure CS22 may include a second lower contact CT22L formed on the fin-type active area FA and a second upper contact CT22U formed on the second lower contact CT22L. The second contact structure CS22 does not contact the first gate line SGLA or the second gate line SGLB.

The second lower contact CT22L may have an upper surface whose height is substantially the same as that of the upper surface of the first lower contact CT11L. Accordingly, the upper surface level of the second lower contact CT22L may be the same as the upper surface level LV_C1 of the first lower contact CT11L.

Similarly with the descriptions with reference to FIGS. 1A through 1F, the second lower barrier layer 144L may be formed on side walls and a bottom surface of the second lower contact CT22L, and the second upper barrier layer 144U may be formed on side walls and a bottom surface of the second upper contact CT22U.

As illustrated in FIG. 3E, the side walls of the first lower contact CT11L and the second lower contact CT22L may be surrounded by a first inter-gate insulating layer 232 and a first insulating interlayer 234 that are sequentially stacked on the isolation layer 112 and the plurality of fin-type active areas FAs. The first inter-gate insulating layer 232 may extend in the direction Y between the adjacent gate lines SGLA and the SGLB which extend in the direction Y. An upper surface level of the first inter-gate insulating layer 232 may be the same as the upper surface level (LV1 of FIG. 3D) of the first gate line SGLA. The first inter-gate insulating layer 232 and the first insulating interlayer 234 may include insulating materials, such as silicon oxide, silicon nitride, silicon oxynitride, etc.

The side walls of the first upper contact CT11U and the second upper contact CT22U may be surrounded by an etch stop layer 242 and a second insulating interlayer 244 that are sequentially stacked. The etch stop layer 242 and the second insulating interlayer 244 may include insulating materials, such as silicon oxide, silicon nitride, silicon oxynitride, etc. Also, the etch stop layer 242 may include a material having an etch selectivity with respect to the first insulating interlayer 234.

The second portion CT11U_2 of the first upper contact CT11U may be surrounded by the first insulating interlayer 234, and a bottom surface of the second portion CT11U_2 may contact the first gate line SGLA. Although FIG. 3E illustrates that a bottom portion of the second portion CT11U_2 contacts a portion of the first inter-gate insulating layer 232, example embodiments are not limited thereto.

As illustrated in FIG. 3D, an insulating capping layer 240 may be formed on the first gate line SGLA and the second gate line SGLB, and the insulating capping layer 240 may be interposed between the first inter-gate insulating layer 232 and the first insulating interlayer 234. The insulating capping layer 240 may serve as a protection layer which limits and/or prevents damage in the first gate line SGLA and the second gate line SGLB which may occur in sequential processes after the first gate line SGLA and the second gate line SGLB are formed. The insulating capping layer 240 may include insulating materials, such as silicon oxide, silicon nitride, silicon oxynitride, etc. However, materials of the insulating capping layer 240 are not limited thereto.

As illustrated in FIG. 3F, the first gate line SGLA and the second gate line SGLB may be separated by a second inter-gate insulating layer 250. The second inter-gate insulating layer 250 may be arranged between the first gate line SGLA and the second gate line SGLB which extend in a straight line along the direction Y and are adjacent to each other. According to example embodiments, the second inter-gate insulating layer 250 may have an upper surface whose height is substantially the same as that of an upper surface of the first inter-gate insulating layer 232.

As illustrated in FIG. 3B, in the plurality of SRAM cells 210A, 210B, 210C, and 210D, a distance S1 between the fin-type active area FA having the channel area of the first conductive type and an adjacent fin-type active area FA having the channel area of the first conductive-type may be substantially the same as a distance S2 between the fin-type active area FA having the channel area of the first conductive-type and an adjacent fin-type active area FA having a channel area of a second conductive-type. For example, in the SRAM cell 210A, the plurality of fin-type active areas FA1, FA2, FA4, and FA5 may be arranged apart from one another by the same distance.

As described with respect to the integrated circuit device 100 of FIGS. 1A through 1F, since the first and second contact structures CS11 and CS22 include metal silicide, the first and second contact structures CS11 and CS22 may have a decreased contact resistance, and the integrated circuit device 200 having a sufficiently low contact resistance even if the first and second contact structures CS11 and CS22 have small sizes may be realized. Also, since the first and second contact structures CS11 and CS22 include the barrier layers 142L, 142U, 144L, and 144U, damage which may be applied to the plurality of fin-type active areas FAs and the adjacent gate line SGLs during the process of forming the first and second contact structures CS11 and CS22, may be limited and/or prevented, and the contact structures CS11 and CS22 which have increased sizes may be formed in a relatively small space. Accordingly, the SRAM cell array 210 in which the plurality of fin-type active areas FAs are arranged to be apart from one another by the same distance may be realized. Thus, the integrated circuit device 200A may have an increased integration density.

Figure 4A:
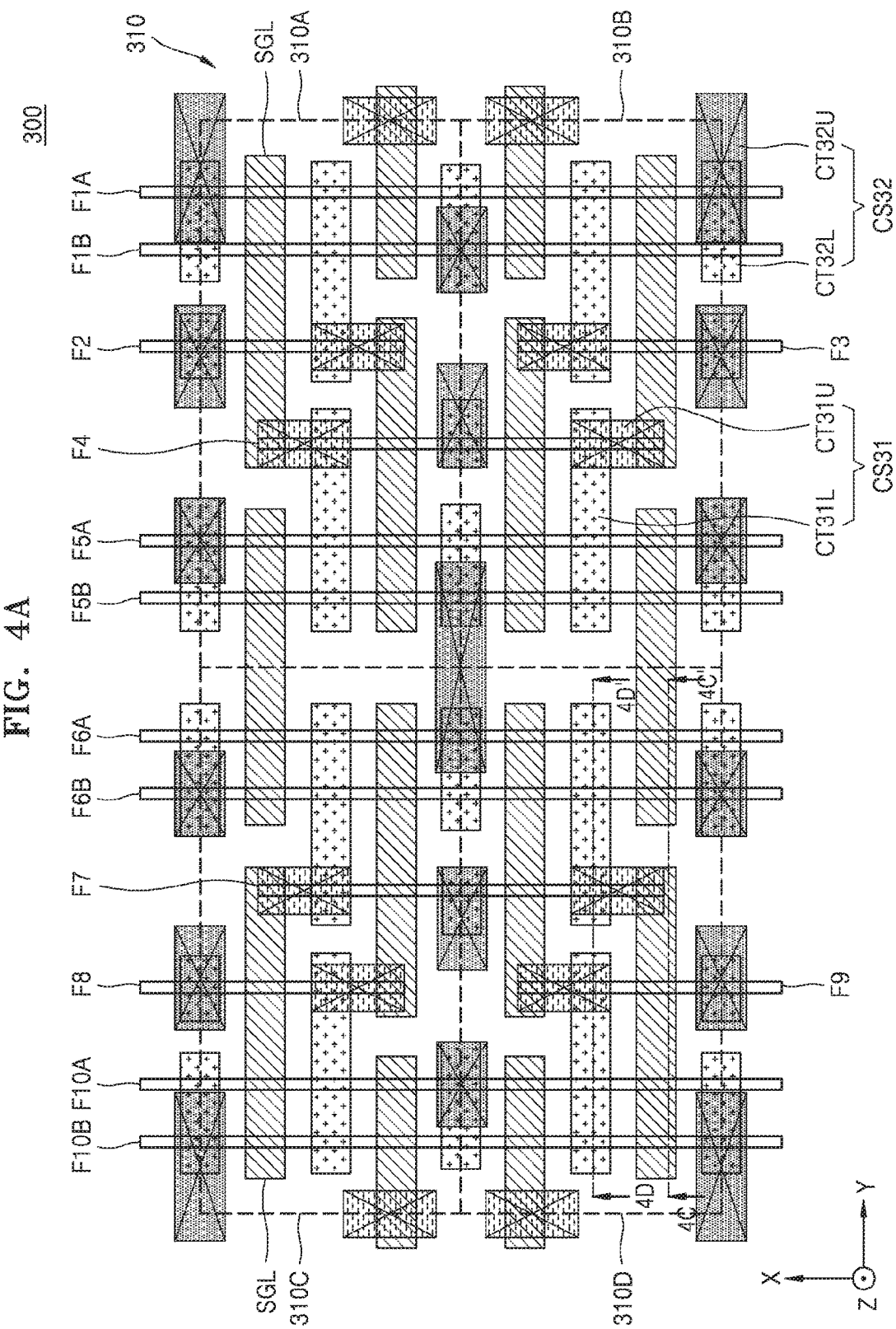
FIGS. 4A through 4D illustrate a plan view, a layout view, and cross-sectional views of an integrated circuit device according to example embodiments.
Figure 4B:
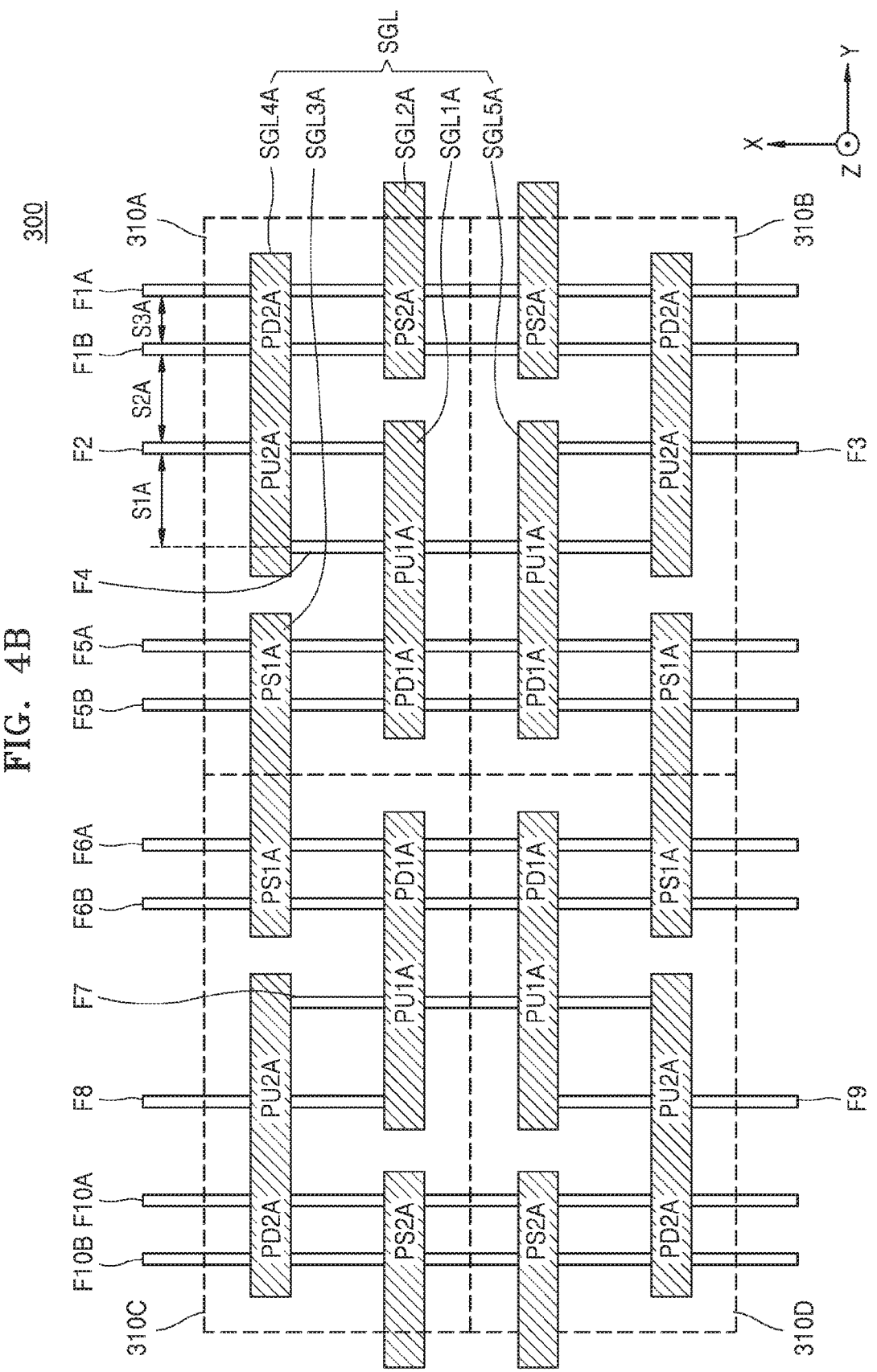
Figure 4C:
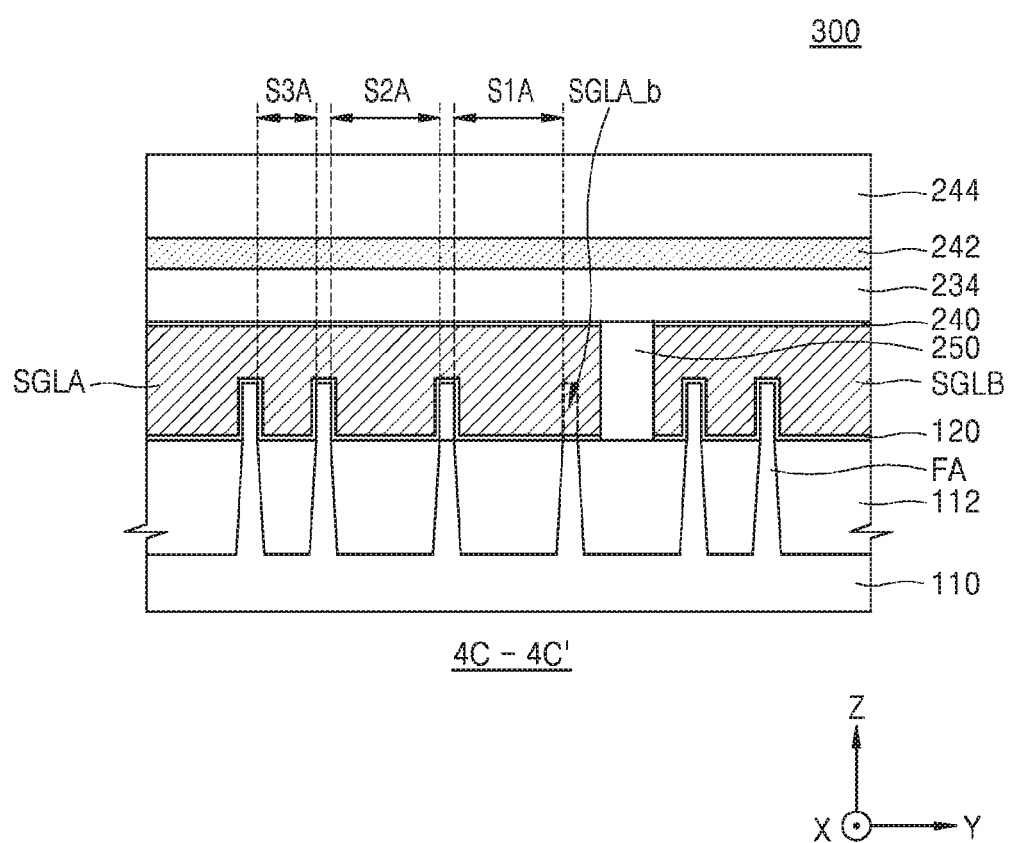
Figure 4D:
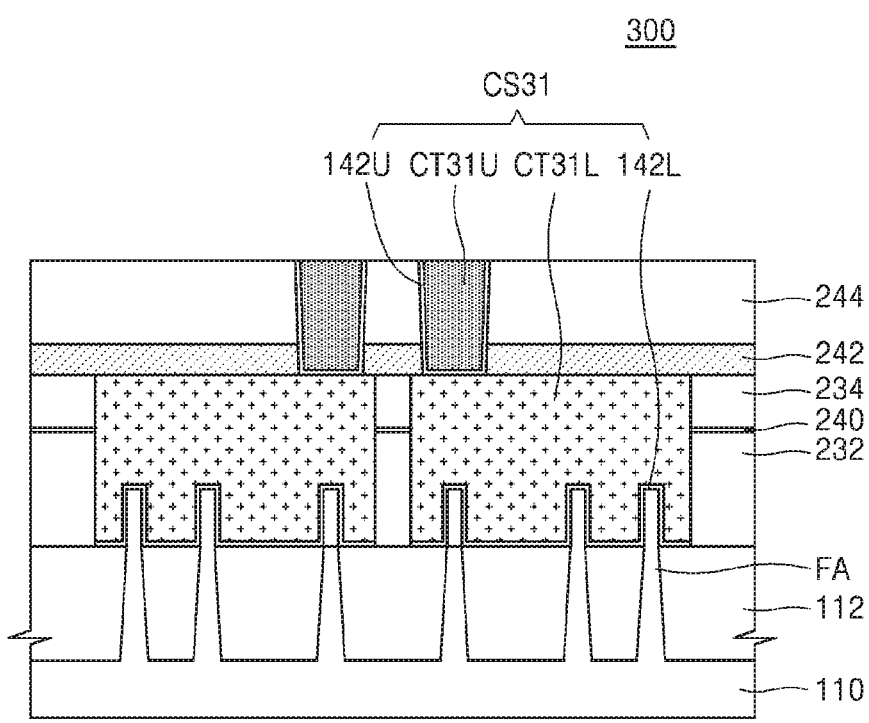
Figure 4D:
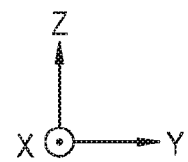

FIGS. 4A through 4D illustrate a plan view, a layout view, and cross-sectional views of an integrated circuit device according to example embodiments. FIG. 4A is a plan view of the main components of the integrated circuit device 300. FIG. 4B is a layout view briefly illustrating arrangement of the fin-type active area FA and gate lines SGL of FIG. 4A. FIG. 4C is a cross-sectional view taken along line 4C-4C' of FIG. 4A. FIG. 4D is a cross-sectional view taken along line 4D-4D' of FIG. 4A. In FIGS. 4A through 4D, like reference numerals refer to like elements in FIGS. 1A through 3G, and their detailed descriptions will be omitted.

Referring to FIGS. 4A through 4D, the integrated circuit device 300 may have similar components to the integrated circuit device 200A described with reference to FIGS. 3A through 3G. However, in the case of the integrated circuit device 300, the fin-type active area FA having the channel area of the second conductive-type, from among the plurality of fin-type active areas FAs, may be the fin-type active area FA having a pair of channel areas of the second conductive-type, the pair of channel areas extending in parallel to each other.

In an SRAM cell 310A, a pair of fin-type active areas F1A and F1B having a channel area of a second conductive-type may be arranged at a side of an adjacent fin-type active area F2 having a channel area of a first conductive-type. Also, a pair of fin-type active areas F5A and F5B having the channel area of the second conductive-type may be arranged at a side of an adjacent fin-type active area F4 having the channel area of the first conductive-type.

In the SRAM cell 310A, a first pass transistor PS1A including two transistors connected in series by the pair of fin-type active areas F5A and F5B may be realized, and a first pull-down transistor PD1A including two transistors connected in series by the pair of fin-type active areas F5A and F5B may be realized. Also, a second pass transistor PS2A including two transistors connected in series by a pair of fin-type active areas F1A and F1B may be realized, and a second pull-down transistor PD2A including two transistors connected in series by the pair of fin-type active areas F1A and F1B may be realized. In FIG. 4A, fin-type areas F6A and 6B and 10A and 10B may be the same as or similar to fin-type areas F1A and F1B and F5A and F5B, respectively.

A first lower contact CT31L of a first contact structure CS31 may extend to cover side walls and an upper surface of the fin-type active area F4 having the channel area of the first conductive-type and to cover side walls and upper surfaces of the adjacent pair of fin-type active areas F5A and F5B having the channel area of the second conductive-type. Also, a second lower contact CT32L of a second contract structure CS32 may be formed to cover the side walls and the upper surfaces of the pair of fin-type active areas F5A and F5B.

Since the first and second pull-down transistors PD1A and PD2A and the first and second pass transistors PS1A and PS2A which are connected in series by the pairs of fin-type active area F5A and F5B and F1A and F1B having the second conductive-type channel areas are formed, the integrated circuit device 300 may have improved performance.

Figure 6A:
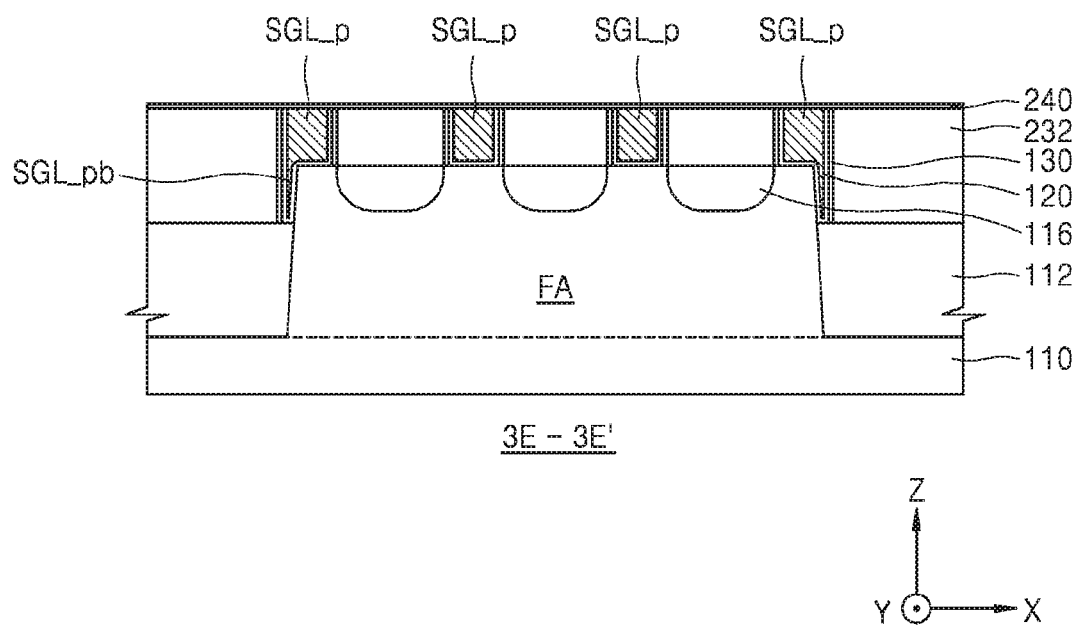
Figure 6B:
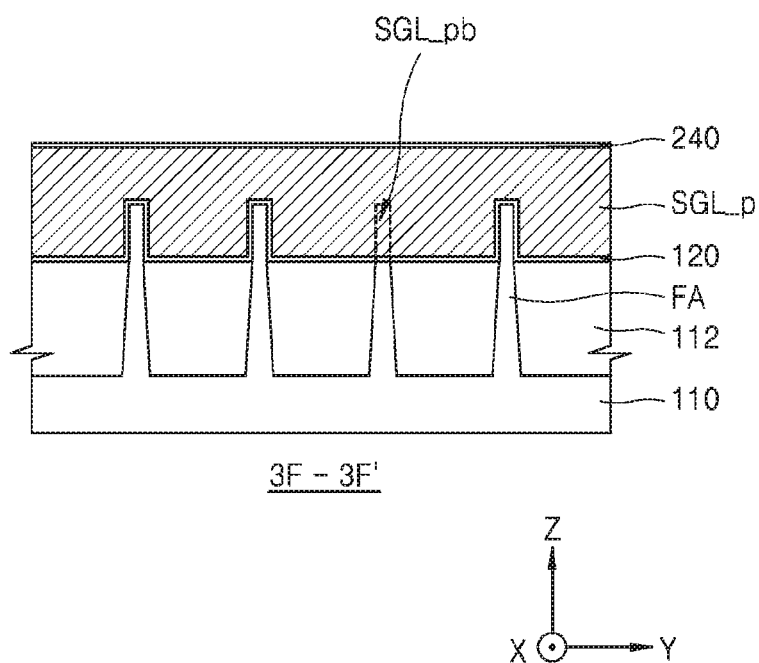
Figure 7:
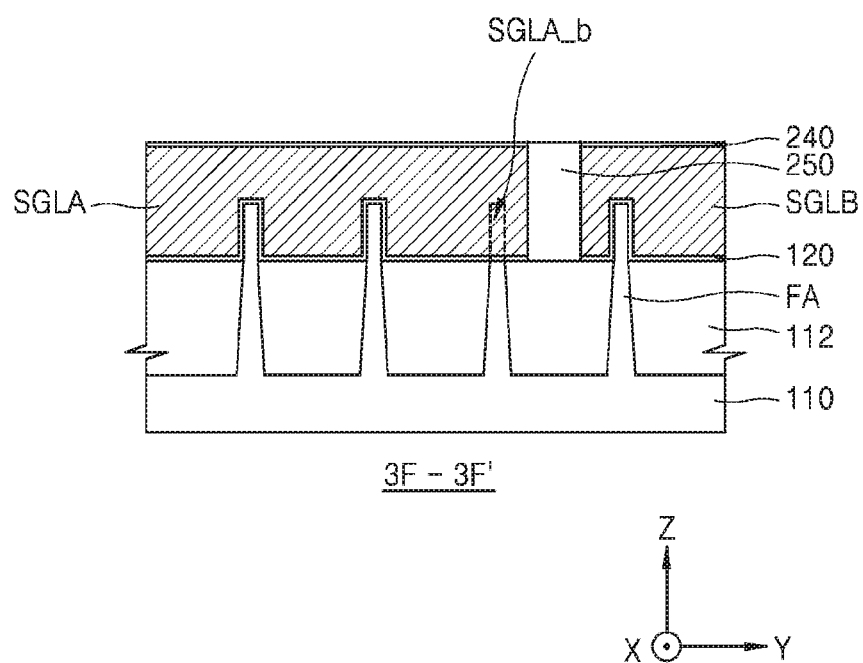
Figure 8A:
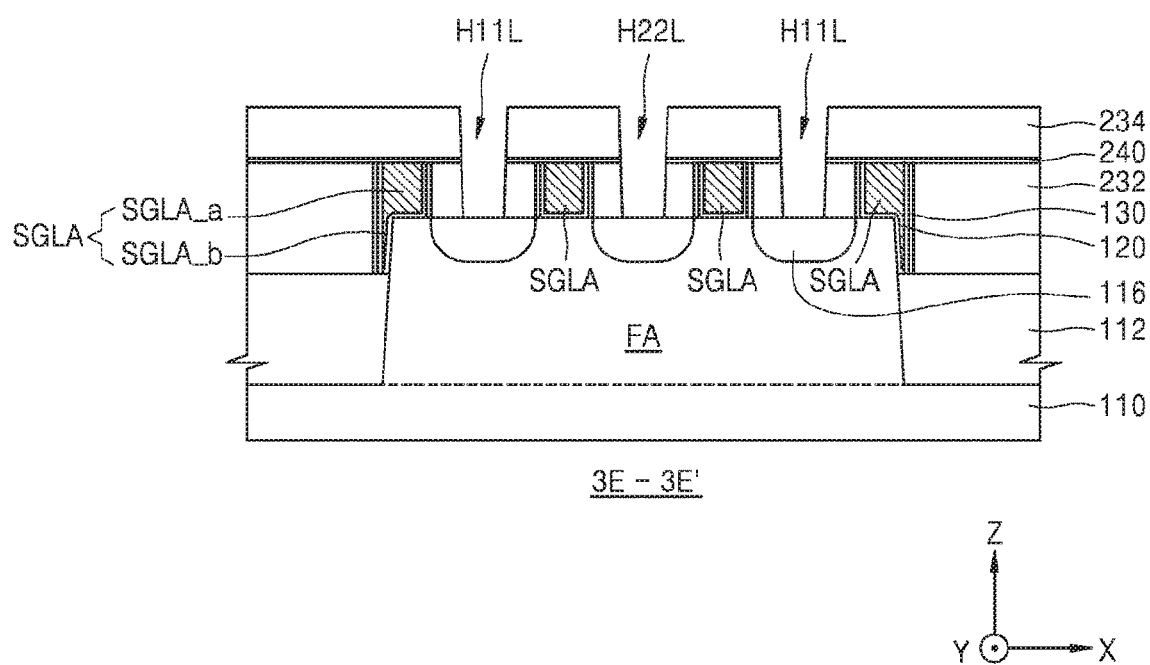
Figure 8B:
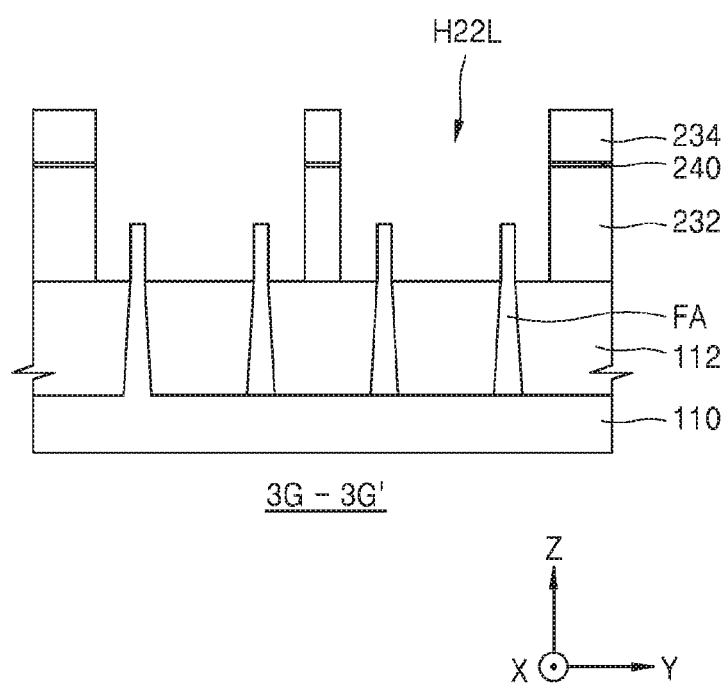

FIGS. 5A, 5B, 6A, 6B, 7, 8A, 8B, and 9 through 11 are cross-sectional views for describing an order of processes for manufacturing an integrated circuit device according to example embodiments. An method according to example embodiments for of manufacturing the integrated circuit device 200A described with reference to FIGS. 3A through 3G will be described by referring to FIGS. 5A through 11. FIGS. 5A, 6A, 8A, and 9 through 11 are cross-sectional views of portions corresponding to a cross-sectional plane taken along line 3E-3E' of FIG. 3A, FIGS. 5B, 6B, and 7 are cross-sectional views of portions corresponding to a cross-sectional plane taken along line 3F-3F' of FIG. 3A, and FIG. 8B is a cross-sectional view of portions corresponding to a cross-sectional plane taken along line 3G-3G' of FIG. 3A. In FIGS. 5A through 11, like reference numerals refer to like elements in FIGS. 3A through 3G, and their detailed descriptions will be omitted.

Figure 5A:
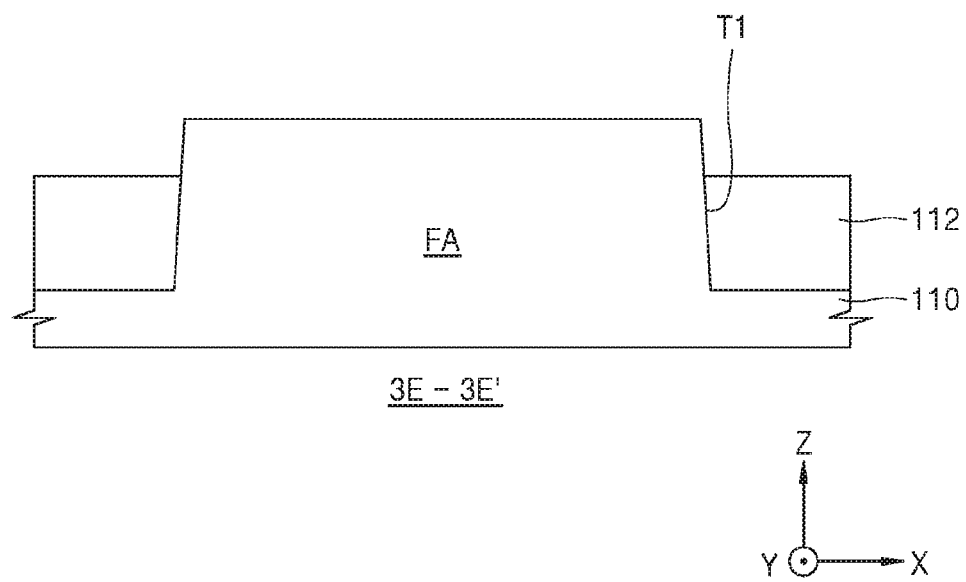
FIGS. 5A, 5B, 6A, 6B, 7, 8A, 8B, and 9 through 11 are cross-sectional views for describing an order of processes for manufacturing an integrated circuit device according to example embodiments.
Figure 5B:
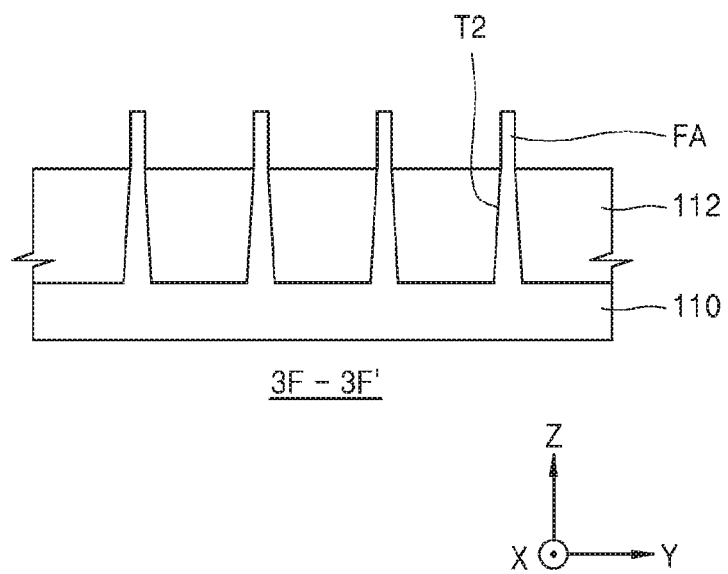

Referring to FIGS. 5A and 5B, a first trench T1 extending in a direction Y and a second trench T2 connected to the first trench T1 and extending in a direction X may be formed on the substrate 110 by forming a mask pattern (not shown) on the substrate 110 and etching a portion of the substrate 110 by using the mask pattern as an etch mask.

When the first and second trenches T1 and T2 are formed on the substrate 110, a plurality of fin-type active areas FAs which protrude upwards from the substrate 110 in a direction (a direction Z) that is perpendicular to a main surface of the substrate 110 and extend in a direction (the direction X) may be obtained.

According to example embodiments, the mask pattern may be formed of a silicon nitride layer, a silicon oxynitride layer, a spin on glass (SOG) layer, a spin on hardmask (SOH) layer, a photoresist layer, or a combination thereof. However, the mask pattern is not limited thereto.

Selectively, a process of oxidizing exposed surfaces of the plurality of fin-type active areas FAs may be performed in order to form a liner (not shown) covering the exposed surfaces of the plurality of fin-type active areas FAs.

Then, the isolation layer 112 filling the first and second trenches T1 and T2 may be formed on the substrate 110. The isolation layer 112 may be formed on lower side walls of the plurality of fin-type active areas FA. Also, an upper surface of the isolation layer 112 may be lower than upper surfaces of the plurality of fin-type active areas FA so that portions of the upper surfaces and side walls of the plurality of fin-type active areas FA may not be covered by the isolation layer 112. According to example embodiments, the isolation layer 112 may be formed by a flowable CVD (FCVD) process or a spin coating process, by using F5G, USG, BPSG, PSG, FOX, PE-TEOS, or TOSZ.

Referring to FIGS. 6A and 6B, a preliminary gate line SGL_p which extends in the direction (the direction Y) that crosses the plurality of fin-type active areas FA may be formed on the substrate 110.

An exemplary process for forming the preliminary gate line SGL_p may be a replacement poly-gate (RPG) process (or a gate last process). For example, a plurality of gate spacers 130 providing a plurality of gate spaces and the first inter-gate insulating layer 232 may be formed. Then, the gate insulating layer 120 and the preliminary gate line SGL_p may be formed in the plurality of gate spaces defined by the plurality of gate spacers 130.

Here, the side wall of the plurality of fin-type active areas FA and a portion of the preliminary gate lines SGL_P may vertically overlap each other so that a portion SGL_pb of the preliminary gate line SGL_P may be formed on the side wall of the plurality of fin-type active areas FA.

According to example embodiments, the gate insulating layer 120 may be formed of a silicon oxide layer, a high-k dielectric layer, or a combination thereof. The high-k dielectric layer may be formed of a material having a greater dielectric constant than a material of a silicon oxide layer. For example, the gate insulating layer 120 may have a dielectric constant of about 10 to about 25. The high-k dielectric layer may be formed of a material selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof. However, materials of the high-k dielectric layer are not limited thereto. According to example embodiments, the gate insulating layer 120 may be formed by an ALD, a CVD, or a PVD process.

The preliminary gate line SGL_p may include a work function adjusting metal-containing layer, a gap-fill metal-containing layer which fills a space formed on an upper portion of the work function adjusting metal-containing layer. According to example embodiments, the preliminary gate line SGL_p may have a multi-layered structure in which a metal nitride layer, a metal layer, a conductive capping layer, and a gap-fill metal layer are sequentially stacked. Each of the metal nitride layer and the metal layer may include at least one metal selected from Ti, W, Ru, Nb, Mo, Hf, Ni, Co, Pt, Yb, Tb, Dy, Er, and Pd. Each of the metal nitride layer and the metal layer may be formed by an ALD, a metal organic ALD (MOALD), or a metal organic CVD (MOCVD) process. The conductive capping layer may serve as a protection layer to limit and/or prevent a surface of the metal layer from being oxidized. Also, the conductive capping layer may serve as a wetting layer to make a deposition process easy when another conductive layer is deposited on the metal layer. The conductive capping layer may be formed of metal nitride, such as TiN, TaN, or a combination thereof, but it is not limited thereto. The gap-fill metal layer may extend on the conductive capping layer. The gap-fill metal layer may be formed of a tungsten layer. The gap-fill metal layer may be formed by an ALD, a CVD, or a PVD process. The gap-fill metal layer may bury a recess formed by a step portion on an upper surface of the conductive capping layer, without a void.

Next, a source/drain area 116 may be formed on the plurality of fin-type active areas FA at both sides of the preliminary gate line SGL_p. Although it is not illustrated, the source/drain area 116 may include a semiconductor layer which is epitaxially grown from the plurality of fin-type active areas FA. The source/drain area 116 may be formed as an embedded SiGe structure including a plurality of SiGe layers that are epitaxially grown, as an epitaxially grown Si layer, or as an epitaxially grown SiC layer.

Then, the insulating capping layer 240 may be formed on the preliminary gate line SGL_p and the first inter-gate insulating layer 232.

Referring to FIG. 7, a mask pattern (not shown) may be formed on the insulating capping layer 240 and the mask pattern may be used as an etch mask to remove a portion of the insulating capping layer 240 and a portion of the preliminary gate line SGL_p, in order to form the first and second gate lines SGLA and SGLB.

Thereafter, an insulating layer (not shown) may be formed on the insulating capping layer 240, and an upper portion of the insulating layer may be planarized until an upper surface of the insulating capping layer 240 is exposed, in order to form the second inter-gate insulating layer 250 between the first and second gate lines SGLA and SGLB.

Referring to FIGS. 8A and 8B, the first insulating interlayer 234 may be formed on the insulating capping layer 240 and the second inter-gate insulating layer 250.

Then, first and second openings H11L and H22L exposing upper surfaces of the plurality of fin-type active areas FA at both sides of the first and second gates lines SGLA and SGLB may be formed on the second insulating interlayer 234.

Figure 9:
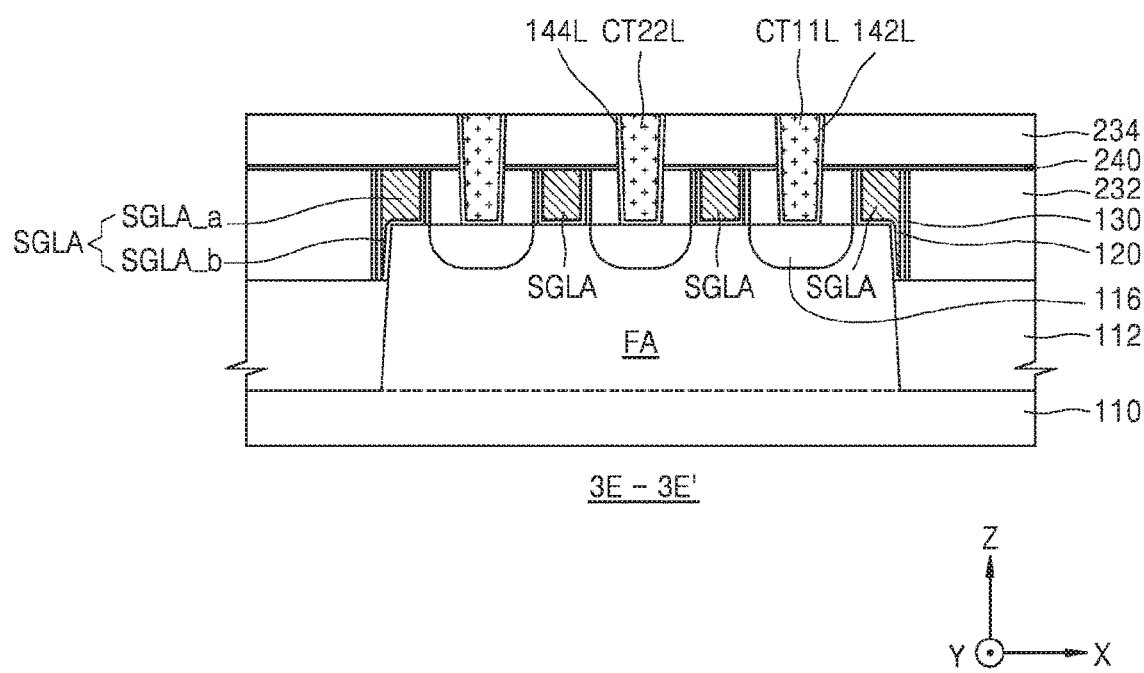

Referring to FIG. 9, the first and second lower barrier layers 142L and 144L may be formed in the first and second openings H11L and H22L. According to example embodiments, the first and second lower barrier layers 142L and 144L may be conformally formed on inner walls of the first and second openings H11L and H22L. The first and second lower barrier layers 142L and 144L may be formed by using titanium nitride, tantalum nitride, tungsten nitride, titanium carbon nitride, etc.

Next, a conductive layer (not shown) may be formed on the first and second lower barrier layers 142L and 144L to fill the first and second openings H11L and H22L, and an upper portion of the conductive layer may be planarized until an upper surface of the first insulating interlayer 234 is exposed, so that the first and second lower contacts CT11L and CT22L filling the first and second openings H11L and H22L may be formed.

According to example embodiments, the conductive layer may be formed of metal silicide by using a CVD or an ALD process. For example, the metal silicide may include nickel silicide, cobalt silicide, tungsten silicide, tantalum silicide, etc. The first and second lower barrier layers 142L and 144L may protect the plurality of fin-type active areas FA from a damage which may occur if a material, such as a source gas, which is used in the process of forming the conductive layer by using metal silicide, penetrates into the plurality of fin-type active areas FA or the first insulating interlayer 234.

Figure 10:
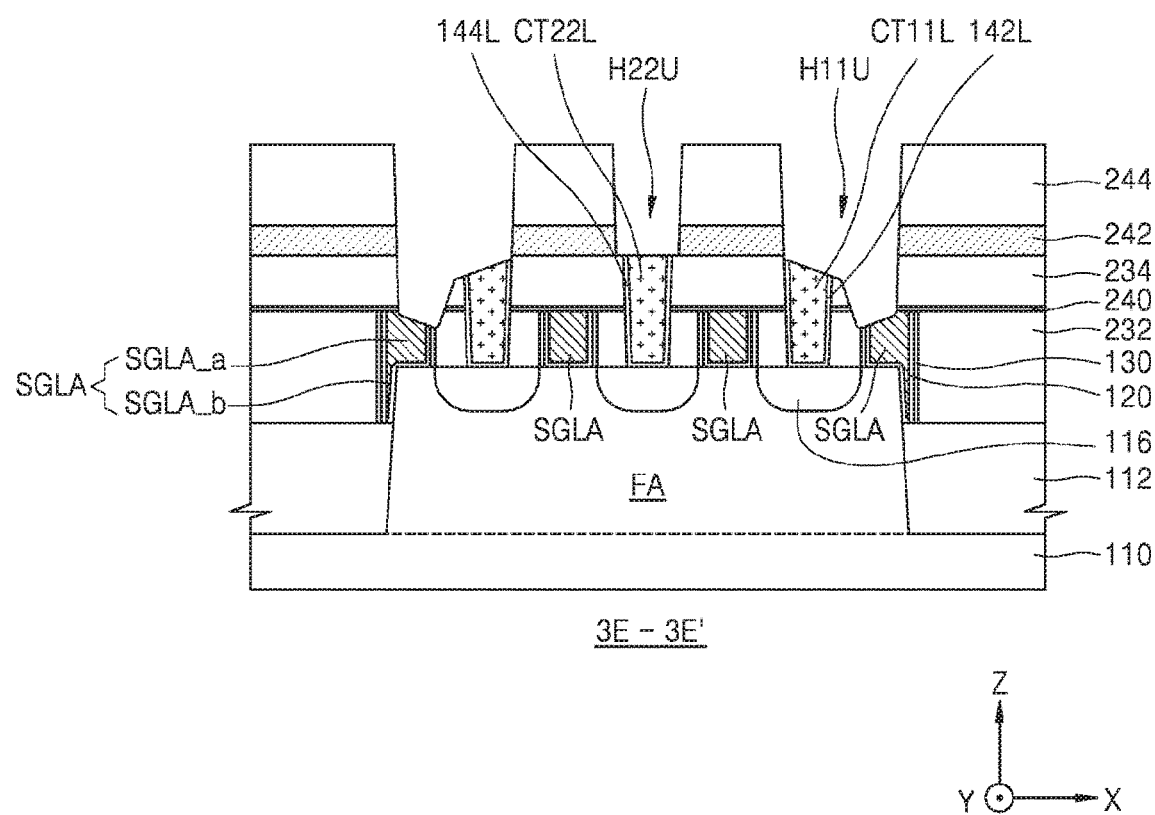

Referring to FIG. 10, the etch stop layer 242 and the second insulating interlayer 244 may be sequentially formed on the first and second lower contacts CT11L and CT22L and the second insulating interlayer 234.

Then, third and fourth openings H11U and H22U exposing upper surfaces of the first and second lower contacts CT11L and CT22L may be formed on the etch stop layer 242 and the second insulating interlayer 244. Here, the third opening H11U may further expose an upper surface of the first gate line SGLA.

In the etching process for forming the third opening H11U, a width of the third opening H11U may be formed to be greater than a width of the first lower contact CT11L, and thus, a portion of the first insulating interlayer 234, which is adjacent to the first lower contact CT11L, may also be etched. According to example embodiments, as the etching process is performed by using an etchant having an etch selectivity between the first insulating interlayer 234 and the first lower contact CT11L, the third opening H11U having a bottom portion which is lower than the upper surface of the first lower contact CT11L may be formed.

Figure 11:
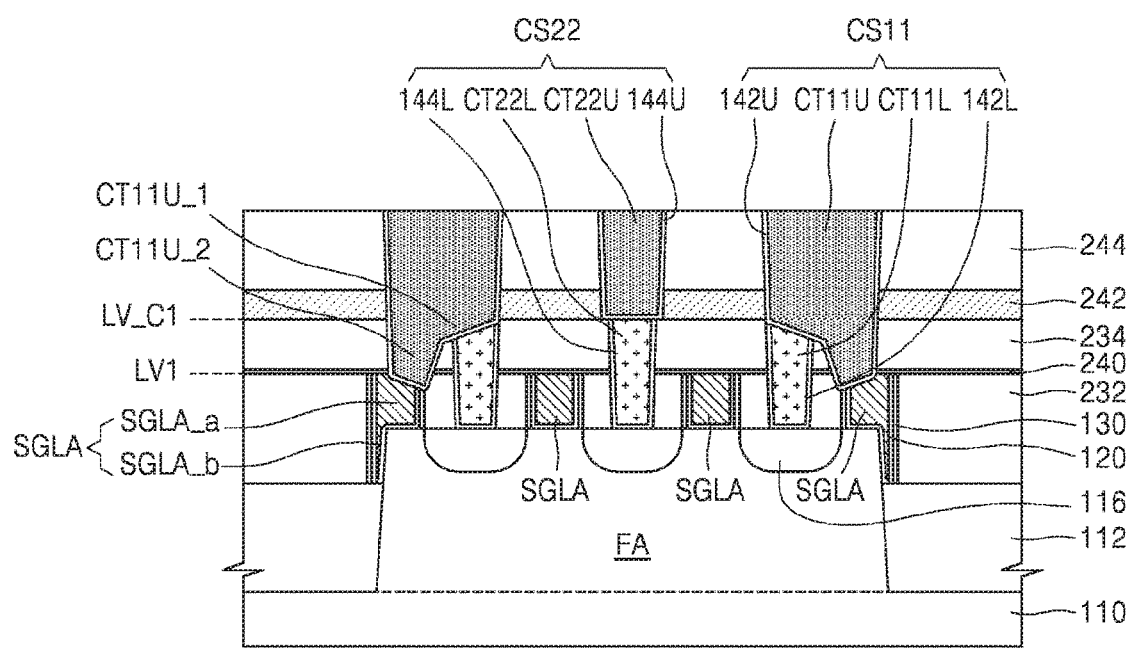

Referring to FIG. 11, the first and second upper barrier layers 142U and 144U may be formed in the third and fourth openings H11U and H22U.

Thereafter, a conductive layer (not shown) filling the third and fourth openings H11U and H22U may be formed on the first and second upper barrier layers 142U and 144U, and an upper portion of the conductive layer may be planarized until an upper surface of the second insulating interlayer 244 is exposed, so that the first and second upper contacts CT11U and CT22U filling the third and fourth openings H11U and H22U may be formed.

The integrated circuit device 200A may be manufactured by performing the above processes.

Figure 12:
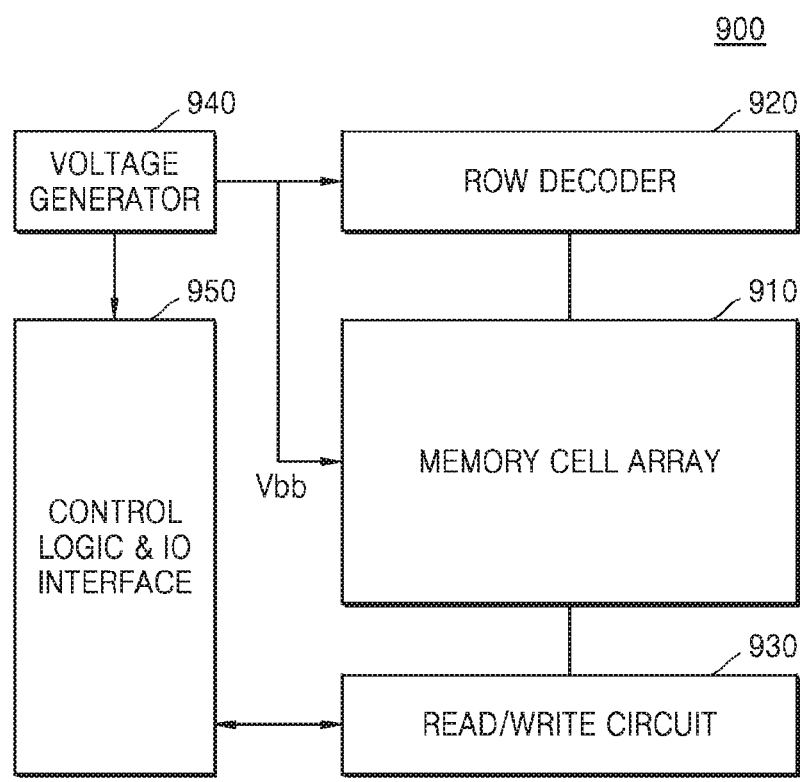
FIG. 12 is a block diagram of a nonvolatile memory device according to example embodiments.

FIG. 12 is a block diagram of a nonvolatile memory device 900 according to example embodiments. Referring to FIG. 12, the nonvolatile memory device 900 including an integrated circuit device according to example embodiments will be described.

Referring to FIG. 12, the nonvolatile memory device 900 may be formed as, for example, a NAND flash memory device. However, according to example embodiments of inventive concepts, the nonvolatile memory device 900 is not limited to the NAND flash memory device, and may be formed as various devices, such as NOR flash memory, resistive random access memory (RRAM), phase-change RAM (PRAM), magnetoresistive random access memory (MRAM), ferroelectric random access memory, etc.

The nonvolatile memory device 900 may be realized as a three dimensional array structure. The nonvolatile memory device 900 may be applied to both a flash memory device in which a charge storage layer is formed of a conductive floating gate, and a charge trap flash (CTF) memory device in which a charge storage layer is formed of an insulating layer.

The nonvolatile memory device 900 may include a memory cell array 910, a row decoder circuit 920, a read/write circuit 930, a voltage generator circuit 940, and a control logic and an input or output interface block 950.

The memory cell array 910 may include memory cells including word lines arranged in a row direction and bit lines arranged in a column direction. The memory cells may form memory blocks.

The row decoder circuit 920 may be controlled by the control logic and the input or output interface block 950, and may select and drive the word lines of the memory cell array 910.

The read/write circuit 930 may be controlled by the control logic and the input or output interface block 950, and may operate as a read circuit or a write circuit according to an operation mode. For example, during a read operation, the read/write circuit 930 may operate as a read circuit for reading data from the memory cell array 910 under a control of the control logic and the input or output interface block 950. During a write (or a program) operation, the read/write circuit 930 may operate as a write circuit for writing data in the memory cell array 910 under a control of the control logic and the input or output interface block 950.

The voltage generator circuit 940 may be controlled by the control logic and the input or output interface block 950 and may generate voltages for operating the nonvolatile memory device 900. For example, the voltage generator circuit 940 may generate word line voltages which are to be provided to the word lines of the memory cell array 910, such as a program voltage, a pass voltage, a verification voltage, a selection voltage, etc., and a well bias voltage Vbb which is to be provided to a substrate of the memory cell array 910 or a well formed on the substrate of the memory cell array 910. The well bias voltage Vbb may be any of 0V and a negative voltage according to an operation mode.

The control logic and the input or output interface block 950 may control overall operations of the nonvolatile memory device 900. The control logic and the input or output interface block 950 may provide a data transfer channel between the nonvolatile memory device 900 and an external device, for example, a memory controller or a host. When a program operation is requested, the control logic and the input or output interface block 950 may control the voltage generator circuit 940 to bias the substrate on which the memory cells are formed or a well formed on the substrate to a negative voltage.

The control logic and the input or output interface block 950 may include at least one of the integrated circuit devices 100, 200, 200A, and 300 according to the example embodiments, or an integrated circuit device which is modified or changed from the integrated circuit devices 100, 200, 200A, and 300 within the scope of example embodiments of inventive concepts.

Figure 13:
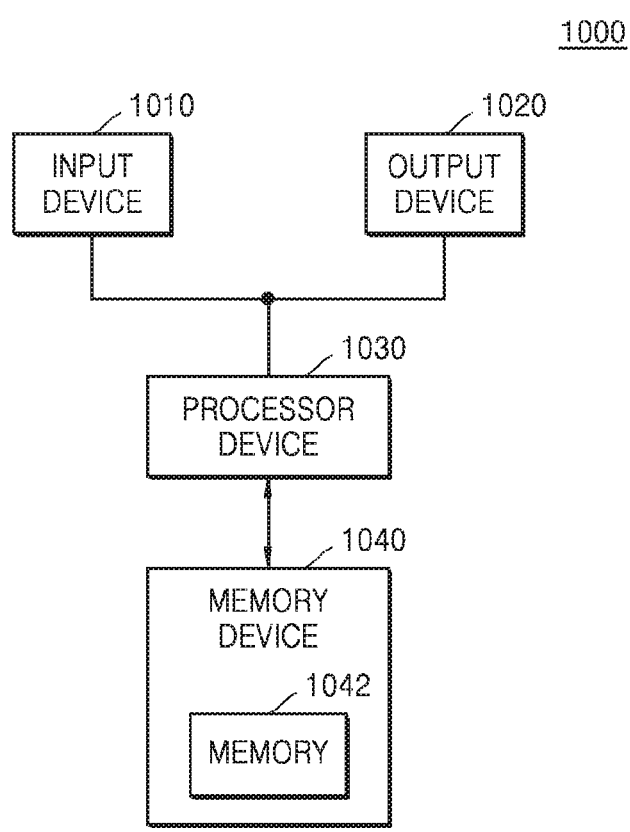
FIG. 13 is a block diagram of an electronic system including an integrated circuit device according to example embodiments.

FIG. 13 is a block diagram of an electronic system 1000 including an integrated circuit device according to example embodiments.

Referring to FIG. 13, the electronic system 1000 includes an input device 1010, an output device 1020, a processor device 1030, and a memory device 1040.

The processor device 1030 may control each of the input device 1010, the output device 1020, and the memory device 1040 via each corresponding interface. The processor device 1030 may include at least one selected from a microprocessor, a digital signal processor, a microcontroller, and at least one of logic devices capable of performing similar functions thereto.

At least one of the processor device 1030 and the memory device 1040 includes at least one of the integrated circuit devices 100, 200, 200A, and 300 according to the example embodiments, or an integrated circuit device which is modified or changed from the integrated circuit devices 100, 200, 200A, and 300 within the scope of example embodiments of inventive concepts.

Each of the input device 1010 and the output device 1020 may include a keypad, a keyboard, or a display device.

The memory device 1040 may include a memory 1042, for example, a volatile memory device, or a nonvolatile memory device, such as a flash memory device.

Figure 14:
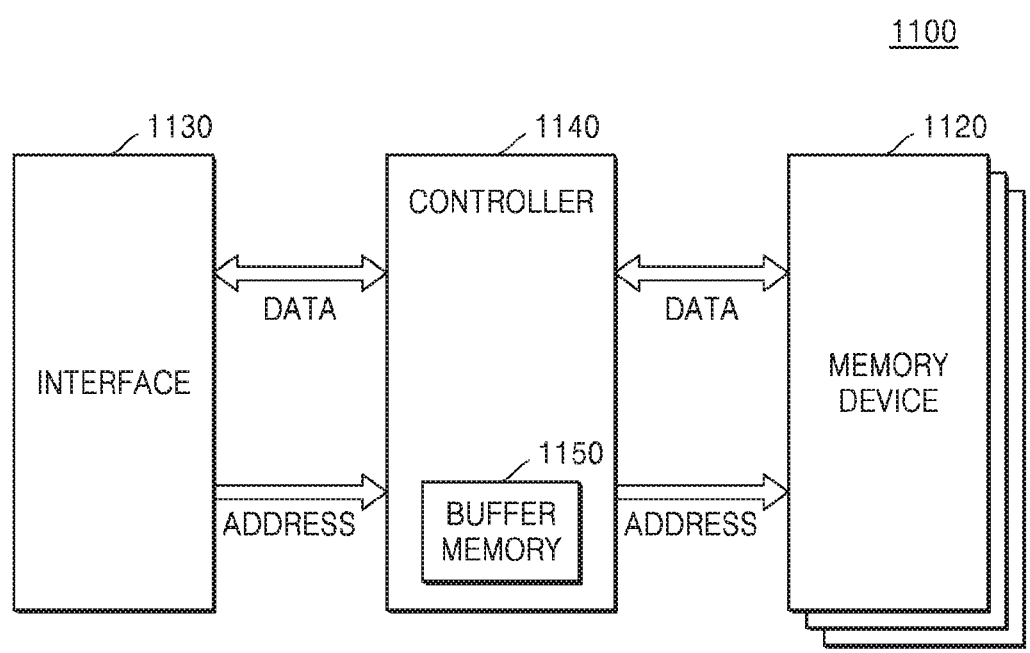
FIG. 14 is a block diagram of a memory system including an integrated circuit device according to example embodiments.

FIG. 14 is a block diagram of a memory system 1100 including an integrated circuit device according to example embodiments.

Referring to FIG. 14, the memory system 1100 may include an interface unit 1130, a controller 1140, and a memory device 1120.

The interface unit 1130 may provide interfacing between a host and a memory system, for example, the electronic system 1000 illustrated in FIG. 28. The interface unit 1130 may include a data exchange protocol corresponding to the host, for the interfacing with the host. The interface unit 1130 may communicate with the host via one of various interface protocols, such as universal serial bus (USB), a multi-media card (MMC), peripheral component interconnect-express (PCI-E), serial-attached SCSI (SAS), serial advanced technology attachment (SATA), parallel advanced technology attachment (PATA), a small computer system interface (SCSI), an enhanced small disk interface (ESDI), integrated drive electronics (IDE), etc.

The controller 1140 may receive data or addresses provided from the outside, via the interface unit 1130. The controller 1140 may access a memory device, for example, the memory device 1040 illustrated in FIG. 28, by referring to the data and the addresses provided from a host. The controller 1140 may transfer data read from the memory device 1120 to the host through the interface unit 1130.

The controller 1140 may include a buffer memory 1150. The buffer memory 1150 may temporarily store write data provided from a host, or data read from the memory device 1120.

The memory device 1120 may be provided as a storage medium of the memory system 1100. For example, the memory device 1120 may be formed of PRAM, MRAM, RERAM, FRAM, NOR flash memory, or a combination thereof. The memory device 1120 includes at least of the integrated circuit devices 100, 200, 200A, and 300 according to example embodiments, or an integrated circuit device modified or changed from the integrated circuit devices 100, 200, 200A, and 300 within the scope of example embodiments of inventive concepts.

The memory system 1100 illustrated in FIG. 14 may be mounted in information processing devices, such as personal digital assistants (PDAs), portable computers, web tablets, digital cameras, portable media players (PMPs), mobile phones, wireless phones, and lap top computers. The memory system 1100 may be realized as an MMC card, a secure digital (SD) card, a micro SD card, a memory stick, an ID card, a personal computer memory card international association (PCMCIA) card, a chip card, a USB card, a smart card, a compact flash (CF) card, etc.

While inventive concepts has been particularly shown and described with reference to example embodiments thereof, it will be understood that various changes in form and details may be made therein without departing from the spirit and scope of the following claims.

What is claimed is:

1. An integrated circuit device comprising:
    a substrate;
    a first fin-type active area and a second fin-type active area spaced apart from each other on the substrate, the first fin-type active area and the second fin-type active area extending in a first direction;
    a first gate line and a second gate line on the substrate, the first gate line and the second gate line extending straight in a second direction that crosses the first direction, and
        the first gate line and the second gate line intersecting the first fin-type active area and the second fin-type active area, respectively;
    a first contact structure on the first fin-type active area,
        the first contact structure at a side of the first gate line,
        the first contact structure contacting the first gate line,
        the first contact structure including a first upper contact on a first lower contact,
        the first lower contact including metal silicide; and
    a second contact structure on the second fin-type active area,
        the second contact structure at a side of the second gate line,
        the second contact structure including a second upper contact on a second lower contact, and
        the second lower contact including metal silicide, wherein
    a width of the first lower contact in the second direction is greater than a width of the first upper contact in the first direction, and
    a width of the first upper contact in the first direction is greater than the width of the first lower contact in the first direction.

2. The integrated circuit device of claim 1, wherein the first upper contact contacts an upper surface of the first gate line.

3. The integrated circuit device of claim 1, wherein
    the first upper contact contacts the first gate line, and a sidewall of the first lower contact is spaced part from a sidewall of the first gate line in the first direction and faces the sidewall of the first gate line.

4. The integrated circuit device of claim 1, wherein a width of the first upper contact in the first direction is greater than a width of the second upper contact in the first direction.

5. The integrated circuit device of claim 1, wherein
    the first upper contact includes a first portion and a second portion,
    the first portion of the first upper contact contacts the first lower contact, and
    the second portion of the first upper contact protrudes downwardly from a side of the first portion and contacts the first gate line.

6. The integrated circuit device of claim 1, wherein the first upper contact is spaced apart from the second lower contact.

7. The integrated circuit device of claim 1, wherein
    the first contact structure further includes a first lower barrier layer that surrounds side walls and a bottom surface of the first lower contact, and the second contact structure further includes a second lower barrier layer that surrounds side walls and a bottom surface of the second lower contact.

8. The integrated circuit device of claim 1, wherein
the first fin-type active area includes a pair of PMOS active areas,
the second fin-type active area includes two pairs of NMOS active areas, and
each pair of the two pairs of NMOS active areas is arranged at each of both sides of the pair of PMOS active areas.

9. An integrated circuit device comprising:
a substrate;
a static random-access memory array on the substrate,
the static random-access memory array including a plurality of static random-access memory cells,
the static random-access memory array including,
  a plurality of first fin-type active areas and a plurality of second fin-type active areas on the substrate and extending in a first direction,
  a first gate line and a second gate line on the substrate and extending in a second direction that crosses the first direction,
the first gate line and the second gate line intersecting the plurality of first fin-type active areas and the plurality of second fin-type active areas, respectively, and
  a first contact structure on one of the plurality of first fin-type active areas at a side of the first gate line and
  a second contact structure on one of the plurality of second fin-type active areas at a side of the second gate line,
the first contact structure including,
  a first lower contact on the plurality of first fin-type active areas, and
  a first upper contact on the first lower contact, the first upper contact contacting a portion of the first gate line, and
  a first lower barrier layer which surrounds side walls of the first lower contact.

10. The integrated circuit device of claim 9, wherein the first lower contact includes metal silicide.

11. The integrated circuit device of claim 9, wherein the second contact structure includes:
a second lower contact on the plurality of second fin-type active areas, and
a second upper contact on the second lower contact, wherein
the second upper contact does not contact the first gate line or the second gate line, and
a height of an upper surface of the first lower contact is substantially equal to a height of an upper surface of the second lower contact.

12. The integrated circuit device of claim 11, wherein the second lower contact extends in the second direction, and
the second lower contact contacts the plurality of second fin-type active areas.

13. The integrated circuit device of claim 9, wherein the static random-access memory array includes a plurality of inverters,
each of the inverters includes a pull-up transistor and a pull-down transistor, a plurality of pass transistors connected to output nodes of the plurality of inverters, respectively,
the first gate line is shared by the pull-up transistor and the pull-down transistor, and
the second gate line is shared by two pass transistors selected from the plurality of pass transistors.

14. The integrated circuit device of claim 9, wherein
the static random-access memory array includes a plurality of NMOS transistors and a plurality of PMOS transistors, and
the second gate line is shared by two NMOS transistors among the plurality of NMOS transistors.

15. The integrated circuit device of claim 9, wherein
the static random-access memory array includes a plurality of NMOS transistors and a plurality of PMOS transistors, and
the first gate line is shared by two transistors that have different conductive-type channels, and
the two transistors are part of the plurality of NMOS transistors and the plurality of PMOS transistors.

16. An integrated circuit device comprising:
a plurality of fins extending in a first direction,
the plurality of fins being spaced apart from each other in a second direction that crosses the first direction,
  the plurality of fins including a first fin and a second fin;
a first lower contact extending in the second direction over the first fin and the second fin;
a second lower contact on the second fin and spaced apart from the first lower contact,
  the first lower contact and the second lower contact being formed of metal silicide;
a first gate line on the first fin and extending in the second direction;
a second gate line on the second fin and extending in the second direction,
  the first gate line and the second gate line being spaced apart from each other;
a first upper contact on the first gate line and the first lower contact,
  the first upper contact extending in the first direction; and
a second upper contact on the second lower contact.

17. The integrated circuit device of claim 16, further comprising:
a substrate; and
a plurality of first and second gate lines on the substrate, wherein
the first fin is one of a plurality of first fins formed in the substrate that extend in the first direction,
the plurality of first fins includes two first fins that are spaced apart from each other in the second direction,
the second fin is one of a plurality of second fins formed in the substrate,
the plurality of second fins includes two second fins that are spaced apart from each other in the second direction and on the substrate,
the two first fins are disposed between the two second fins,
a first one of the first gate lines extends in the second direction over the two first fins and a first one of the two second fins,
a second one of the first gate lines extends in the second direction over the two first fins and a second one of the two second fins,
a first one of the second gate lines is connected to the first one of the two second fins, and
a second one of the second gate lines is connected to the second one of the two second fins.

18. The integrated circuit device of claim 16, further comprising:
a gate insulating layer between the first gate line and the first fin, wherein the first gate line includes a first portion and a second portion, the first portion is on an upper surface of the first fin, the second portion is adjacent to a sidewall of the first fin, and the gate insulating layer is between the first fin and the first and second portions of the first gate line.

19. The integrated circuit of claim 16, wherein an upper surface of the first lower contact is higher than an upper surface of the first gate line.

20. The integrated circuit device of claim 16, further comprising:

a substrate, wherein the first and second fins are formed in the substrate, the first fin includes a channel area of a PMOS transistor, and the second fin includes a channel area of a NMOS transistor.

\* \* \* \* \*